US008620240B2

(12) United States Patent
Yamanouchi et al.

(10) Patent No.: US 8,620,240 B2
(45) Date of Patent: Dec. 31, 2013

(54) POWER AMPLIFIER AND POWER AMPLIFYING METHOD

(75) Inventors: Shingo Yamanouchi, Tokyo (JP); Kazuaki Kunihiro, Tokyo (JP); Kazumi Shiikuma, Tokyo (JP)

(73) Assignee: NEC Corporation, Tokyo (JP)

( * ) Notice: Subject to any disclaimer, the term of this patent is extended or adjusted under 35 U.S.C. 154(b) by 135 days.

(21) Appl. No.: 13/143,417

(22) PCT Filed: Jan. 27, 2010

(86) PCT No.: PCT/JP2010/000457
§ 371 (c)(1),
(2), (4) Date: Jul. 6, 2011

(87) PCT Pub. No.: WO2010/089971
PCT Pub. Date: Aug. 12, 2010

(65) Prior Publication Data
US 2011/0279180 A1    Nov. 17, 2011

(30) Foreign Application Priority Data

Feb. 5, 2009   (JP) ................................. 2009-024691

(51) Int. Cl.
*H01Q 11/12* (2006.01)
*H04B 1/04* (2006.01)

(52) U.S. Cl.
USPC ...................... 455/127.1; 455/114.2; 375/297

(58) Field of Classification Search
USPC .......... 455/114.1, 114.3, 127.1, 127.2, 127.5; 375/296, 297; 330/207 R, 254, 278
See application file for complete search history.

(56) References Cited

U.S. PATENT DOCUMENTS

| 5,420,536 | A | * | 5/1995 | Faulkner et al. | ............... 330/149 |
| 5,905,407 | A | | 5/1999 | Midya | |
| 7,368,985 | B2 | * | 5/2008 | Kusunoki | ......................... 330/10 |
| 7,460,842 | B2 | * | 12/2008 | Black et al. | ................. 455/127.1 |

FOREIGN PATENT DOCUMENTS

| CN | 1535497 A | | 10/2004 | |
| JP | 7-283656 A | | 10/1995 | |
| JP | 07-283656 A | * | 10/1995 | ............... H03F 1/02 |
| JP | 2002252524 A | | 9/2002 | |

(Continued)

OTHER PUBLICATIONS

International Search Report for PCT/JP2010/000457 mailed Mar. 2, 2010.

(Continued)

*Primary Examiner* — Quochien B Vuong

(57) ABSTRACT

An aspect of a power amplifier according to the present invention is a power amplifier that amplifies a modulated signal including amplitude modulated components and phase modulated components, the power amplifier including a first voltage source 21 that amplifies low-frequency components of the amplitude modulated components of the modulated signal to output a first voltage VC_L, a second voltage source 22 that amplifies high-frequency components of the amplitude modulated components of the modulated signal to output a second voltage VC_H, a current source 24 that amplifies amplitude components of the modulated signal to output a current, a combiner circuit 23 that combines the first voltage VC_L, the second voltage VC_H, and a current IM to generate a modulated power supply signal VOUT, and an RF amplifier 30 that amplifies a signal obtained by up-converting the modulated signal to a carrier frequency and outputs the amplified signal after modulating amplitude of the amplified signal by the modulated power supply signal VOUT. In this way, power efficiency of a circuit that generates a modulated power supply can be improved.

16 Claims, 18 Drawing Sheets

(56) References Cited

FOREIGN PATENT DOCUMENTS

| | | |
|---|---|---|
| JP | 2003533116 A | 11/2003 |
| JP | 2006514472 A | 4/2006 |
| JP | 2007215158 A | 8/2007 |
| JP | 2007318359 A | 12/2007 |
| WO | 2008105073 A | 9/2008 |
| WO | WO 2008105073 A1 * | 9/2008 ............ H03F 1/06 |

OTHER PUBLICATIONS

Chinese Office Action for CN Application No. 201080006876.7 issued on Sep. 4, 2013 with English Translation.

* cited by examiner

POWER AMPLIFIER AND POWER AMPLIFYING METHOD

TECHNICAL FIELD

The present invention relates to a power amplifier and a power amplifying method, and more specifically, to a power amplifier and a power amplifying method that amplify a modulated signal including amplitude modulated components and phase modulated components.

BACKGROUND ART

A transmission power amplifier (Power Amplifier: PA) used in a radio communication device especially consumes high power in the communication device. Accordingly, improving power efficiency of the power amplifier is the most important issue in developing communication devices. According to a recent communication standard, performing amplitude modulation has become the mainstream in order to achieve spectral efficiency. This amplitude modulation strictly requires avoidance of signal distortion. Therefore, the power amplifier used in the communication device is operated with deep back-off (i.e. low input power) state in order to improve linearity. However, performance of the deep back-of operation leads to reduction in power efficiency in the power amplification.

In order to achieve both of the improvement of the power efficiency and linearity in the power amplifier, a polar modulation technique has frequently been proposed in recent years. The polar modulation technique uses a polar modulator, an RF (Radio Frequency) amplifier, and a power supply modulator. The polar modulator extracts amplitude modulated components and phase modulated components of a modulated signal (e.g., transmission signal data). Now, the polar modulation technique includes an ET (Envelope Tracking) system and an EER (Envelope Elimination and Restoration) system. In the ET system, the polar modulator outputs an RF (Radio Frequency) modulated signal in which amplitude modulated components and phase modulated components are up-converted to a carrier frequency. In the EER system, the polar modulator outputs an RF modulated signal in which phase modulated components of the extracted modulated components are up-converted to a carrier frequency. Further, the polar modulator outputs amplitude modulated components of the extracted modulated components to the power supply modulator. The power supply modulator modulates power supplied to the RF amplifier according to the amplitude modulated components input from the polar modulator. The RF amplifier amplifies the RF modulated signal input from the polar modulator, and modulates and outputs the RF modulated signal amplified based on the power supply modulated by the power supply modulator.

According to the polar modulation technique, the power supply supplied to the RF amplifier is modulated according to the amplitude of the RF modulated signal input to the RF amplifier. Accordingly, the polar modulation technique reduces power consumption when the voltage output by the RF amplifier is low level.

However, when performing power amplification of the modulated signal using the polar modulation technique, high performance is required in the power supply modulator in order to improve the accuracy of the signal that is output at the last stage. For example, the power supply modulator is required to satisfy characteristics that it accurately performs wide band (i.e. high-speed) operations, output high voltage and signals with low noise because of its wide operation range (i.e. wide dynamic range), and realizes high power efficiency at the same time. Several techniques for satisfying these characteristics are disclosed in Patent literatures 1 to 5.

First, FIG. 20 shows a block diagram of a power amplifier 100 disclosed in Patent literature 1. As shown in FIG. 20, the power amplifier 100 includes an error correction unit 113 that corrects a signal error of a pulse modulation unit 112. The pulse modulation unit 112 is implemented by a switching amplifier with high power efficiency. Then, the pulse modulation unit 112 supplies power to an RF amplifier 111. At this time, the power amplifier 100 corrects, in the error correction unit 113, switching noise generated in the pulse modulation unit 112. In this way, the power amplifier 100 suppresses the influence of the switching noise given to the RF amplifier 111. In short, the power amplifier 100 achieves improvement of power efficiency and wide dynamic range (i.e. low noise) characteristics by implementing the pulse modulation unit 112 and the error correction unit 113 with high power efficiency.

Now, the pulse modulation unit 112, the error correction unit 113, and a low pass filter 114 of the power amplifier 100 will be described further in detail. FIG. 21 shows a block diagram of the pulse modulation unit 112, the error correction unit 113, and the low pass filter 114 of the power amplifier 100. In the block diagram shown in FIG. 21, the pulse modulation unit 112 includes a pulse modulator 150, a switching amplifier 124, an attenuator 125, and an integrator 126, and the error correction unit 113 includes an error amplifier 131, an attenuator 133, and an adder 132.

Each of the part in which the pulse modulation unit 112 and the low pass filter (LPF) 114 are combined, and the error amplifier 131 can be regarded as a voltage source that outputs a desired voltage by voltage feedback. Further, the adder 132 is implemented by a capacitor, and has high pass filter (HPF) characteristics. Therefore, it can be regarded that the part in which the pulse modulation unit 112 and the LPF 114 are combined operates as a voltage source for low-frequency components, the error amplifier 131 operates as a voltage source for high-frequency components, and the adder 132 operates as a high pass filter. In short, the circuit shown in FIG. 21 supplies a voltage obtained by combining the voltage generated by the voltage source for low-frequency components and the voltage generated by the voltage source for high-frequency to the RF amplifier as the modulated power supply.

The power amplifier 100 connects, the voltage source with low output impedance, which is the part in which the pulse modulation unit 112 and the low pass filter 114 are combined, and the error amplifier 131 in parallel, which causes short-circuit between these voltage sources and flow of high unnecessary current. In the power amplifier 100, in order to prevent such a problem, an adder (high pass filter) 132 is inserted between voltage sources to prevent a current from flowing between voltage sources in a desired signal band (i.e. low frequency) with high power density. Further, in the power amplifier 100, the adder (high pass filter) 132 allows an out-of-band current (i.e. high frequency current) to flow in order to suppress out-of-band noise (i.e. high frequency noise). In this way, it is possible to suppress unnecessary current between voltage sources to some extent in the desired signal band while suppressing out-of-band nose. However, according to this system, the signal distortion in the desired signal band (i.e. low frequency) cannot be corrected. Furthermore, when the cutoff frequency of the high pass filter 132 is set to be within the desired band so as to correct the signal distortion within the desired signal band (i.e. low frequency), the unnecessary current between the voltage sources increases, and the power efficiency is consequently decreased. In summary, there is a trade-off between the signal accuracy and the power efficiency in this system.

A method of preventing the problem in Patent literature 1 is suggested in Patent literature 2. FIG. 22 shows a block diagram of a power amplifier 200 disclosed in Patent literature 2. As shown in FIG. 22, in the power amplifier 200, a linear amplifier 202 applies a desired voltage to a load 211. The linear amplifier 202 is of voltage-follower type, thereby it is operated as a voltage source with low output impedance. Further, a desired current is supplied from a switching amplifier 242 to the load 211. The switching amplifier 242 performs pulse modulation control based on a detected current at a sense resistor 208 by a pulse modulator 236, thereby operating as a current source that outputs a desired current. Accordingly, in the power amplifier 200, it can be considered that the linear amplifier 202 is used as a voltage source and the switching amplifier 242 is used as a current source. Then, the power amplifier 200 supplies power to a load (i.e. RF amplifier) by the voltage source and the current source connected in parallel. Further, the power amplifier 200 detects a current Ilin from the voltage source, to control an output current Isw from the current source. Further, the power amplifier 200 uses the linear amplifier 202 having small error with respect to the load 211 as the voltage source, thereby capable of suppressing an error of the output voltage Vout. Further, most part of the power is supplied from the switching amplifier 242 with high efficiency, thereby achieving high power efficiency. Further, since the output impedance of the current source is high, the unnecessary power due to the short-circuit between the voltage source and the current source does not flow.

The similar method as that disclosed in Patent literature 2 is also disclosed in Patent literatures 3 and 4. FIG. 23 shows a power amplifier 300 disclosed in Patent literature 3. In the power amplifier 300, a circuit that includes a buffer amplifier circuit 310 and a class-AB amplifier 322 is used as a voltage source, and a circuit that includes a current sensor 338, a pulse width modulator 340, and a DC/DC converter 324 is used as a current source. Further, FIG. 24 shows a block diagram of a power amplifier 400 disclosed in Patent literature 4. In the power amplifier 400, an analog linear amplifier 405 is used as a voltage source, and a non-linear amplifier 403 is used as a current source. As is similar to the power amplifier 200, in both of the power amplifiers 300 and 400, most part of the power is supplied from the current source with high efficiency, and the error of the output voltage Vout is suppressed by the voltage source with high accuracy, thereby achieving both of the high signal accuracy and the high power efficiency.

Furthermore, Patent literature 5 discloses a power amplifier that uses a linear regulator that amplifies an amplitude modulated signal of low-frequency components, a high-pass filter that amplifies an amplitude modulated signal of high-frequency components, and a high-frequency signal amplifier. The power amplifier disclosed in Patent literature 5 combines signals generated by the linear regulator and the high-frequency signal amplifier, thereby improving the signal accuracy.

CITATION LIST

Patent Literature

Patent Literature 1
Japanese Unexamined Patent Application Publication No. 2007-215158
Patent Literature 2
U.S. Pat. No. 5,905,407
Patent Literature 3
Published Japanese Translation of PCT International Publication for Patent Application No. 2003-533116
Patent Literature 4
Japanese Unexamined Patent Application Publication No. 2002-252524
Patent Literature 5
Japanese Unexamined Patent Application Publication No. 2007-318359

SUMMARY OF INVENTION

Technical Problem

In the Patent literatures 2 to 4, the current source in the power supply modulator is implemented by a switching amplifier with high power efficiency, and generates high current supplied to the RF amplifier. However, a high-speed switching operation is difficult in a switching amplifier that addresses with high current, and it is impossible to output a current that follows the high-frequency components of the output signal of the power supply modulator. Thus, the current corresponding to the high-frequency components should be output from the voltage source implemented by the linear amplifier with low power efficiency. This causes high power consumption at the voltage source in the power supply modulator of the power amplifiers disclosed in Patent literatures 2 to 4. Further, in Patent literature 5, the linear regulator in the power supply modulator outputs low-frequency components of the output signal, and the high-frequency signal amplifier outputs the high-frequency components. However, the power efficiency is low and the power consumption of the power supply modulator increases in both of the linear regulator and the high-frequency signal amplifier. In view of such a problem, the present invention aims to reduce power consumption in the power amplifier.

Solution to Problem

An exemplary aspect of a power amplifier according to the present invention is a power amplifier that amplifies a modulated signal including amplitude modulated components and phase modulated components, the power amplifier including: a first voltage source that amplifies low-frequency components of the amplitude modulated components of the modulated signal to output a first voltage; a second voltage source that amplifies high-frequency components of the amplitude modulated components of the modulated signal to output a second voltage; a current source that amplifies amplitude components of the modulated signal to output a current; a combiner circuit that combines the first voltage, the second voltage, and the current to generate a modulated power supply signal; and an RF amplifier that amplifies a signal obtained by up-converting the modulated signal to a carrier frequency the amplified signal after modulating amplitude of the amplified signal by the modulated power supply.

An exemplary aspect of a power amplifying method according to the present invention is a power amplifying method that amplifies a modulated signal including amplitude modulated components and phase modulated components, the method including: amplifying low-frequency components of amplitude components of the modulated signal to output a first voltage; amplifying high-frequency components of amplitude components of the modulated signal to output a second voltage; amplifying amplitude components of the modulated signal to output a current; combining the first voltage, the second voltage, and the current to generate a modulated power supply signal, and amplifying a signal obtained by up-converting the modulated signal to a carrier frequency, and outputting the amplified signal after modulating amplitude of the amplified signal by the modulated power supply.

Advantageous Effects of Invention

According to a power amplifier and a power amplifying method according to the present invention, it is possible to reduce power consumption in the power amplifier while improving the signal accuracy.

BRIEF DESCRIPTION OF DRAWINGS

FIG. 19 is a circuit diagram showing a variant example of the power supply modulator according to the third exemplary embodiment;

DESCRIPTION OF EMBODIMENTS

First Exemplary Embodiment

Figure 1:
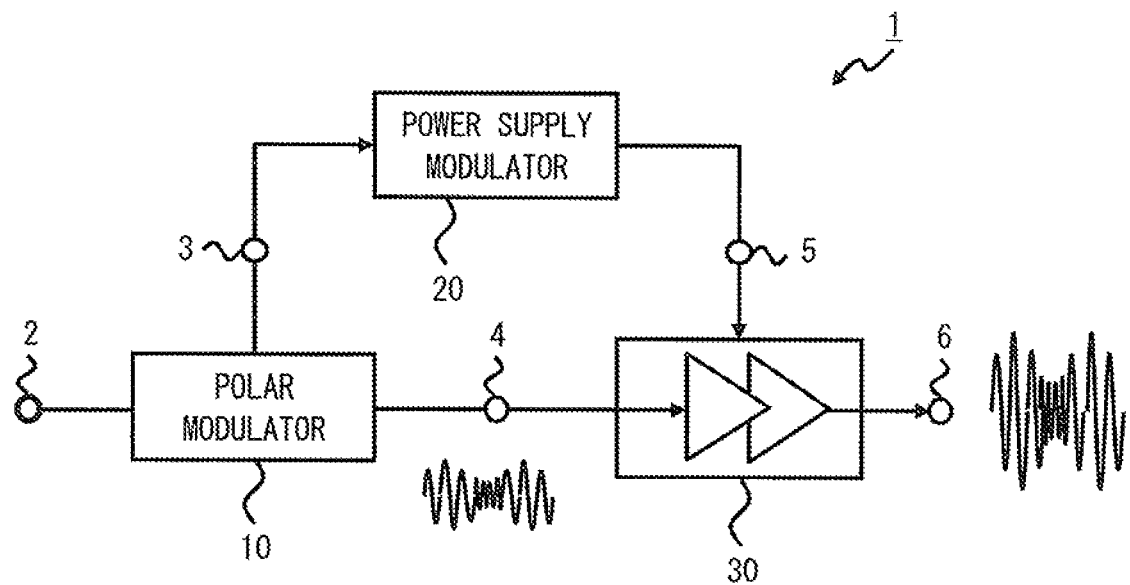
FIG. 1 is a block diagram of a power amplifier according to a first exemplary embodiment.

Hereinafter, exemplary embodiments of the present invention will be described with reference to the drawings. FIG. 1 shows a block diagram of a power amplifier 1 according to the first exemplary embodiment. The power amplifier shown in FIG. 1 performs power amplification by ET (Envelope Tracking) system. As shown in FIG. 1, the power amplifier 1 includes a polar modulator 10, a power supply modulator 20, and an RF (Radio Frequency) amplifier 30. The power amplifier 1 further includes an input terminal 2, an output terminal 6, and terminals 3 to 5. The power amplifier 1 receives a modulated signal (data signal) that is to be transmitted by the input terminal 2, and outputs an amplified modulated signal from the output terminal 6. Further, the polar modulator 10 and the power supply modulator 20 are connected by the terminal 3, the polar modulator 10 and the RF amplifier 30 are connected by the terminal 4, and the power supply modulator 20 and the RF amplifier 30 are connected by the terminal 5.

The polar modulator 10 extracts amplitude modulated components and phase modulated components of the data signal. The polar modulator 10a used in the ET system outputs the amplitude modulated components to the power supply modulator 20 (or terminal 3) as an amplitude modulated signal, up-converts amplitude modulated components and phase modulated components to a carrier frequency in order to generate an RF modulated signal, and outputs the RF modulated signal to the RF amplifier 30 (or terminal 4). The polar modulator 10 outputs the RF modulated signal supplied to the RF amplifier 30 and the amplitude modulated component signal supplied to the power supply modulator 20 at separate timings.

The power supply modulator 20 generates a modulated power supply signal obtained by modulating a power supply based on the amplitude modulated signal output from the polar modulator 10, to supply the modulated power supply signal to the RF amplifier 30. The detail of the power supply modulator 20 will be described later.

The RF amplifier 30 operates based on the modulated power supply signal generated by the power supply modulator 20, amplifies the RF modulated signal output from the polar modulator 10, and outputs the amplified signal from the output terminal 6. At this time, the RF amplifier 30 modulates the RF modulated signal by the modulated power supply signal.

Figure 2:
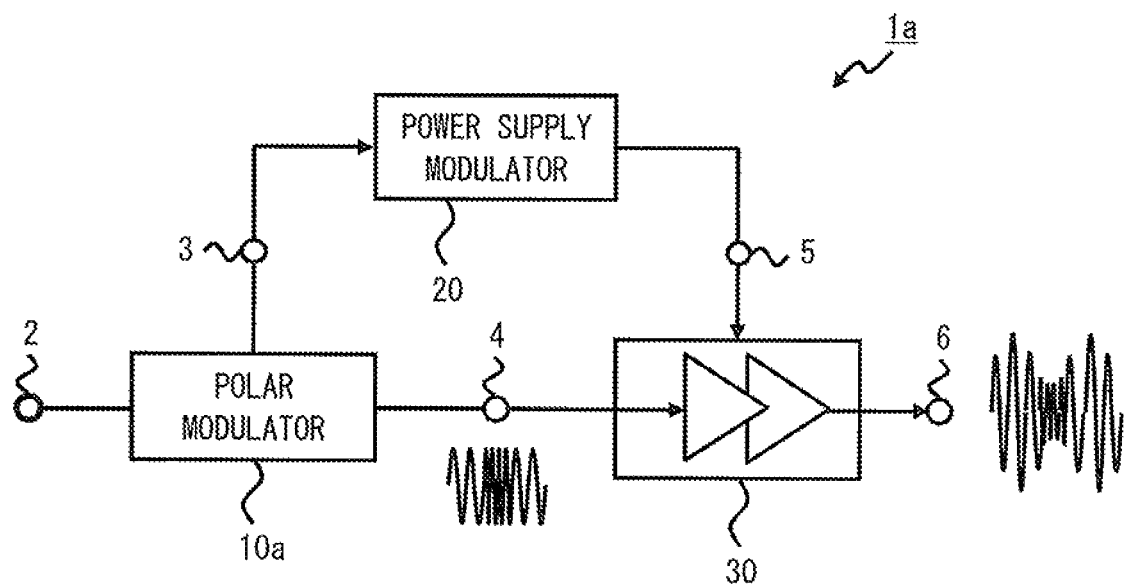
FIG. 2 is a block diagram of the power amplifier according to the first exemplary embodiment.

Note that the present invention can also be applied to a power amplifier that performs power amplification by EER (Envelope Elimination and Restoration) system. FIG. 2 shows a block diagram of a power amplifier 1a that employs the EER system. As shown in FIG. 2, when the EER system is employed, a polar modulator 10a is used in place of the polar modulator 10. The polar modulator 10a used in the EER system supplies amplitude modulated components to the power supply modulator 20 (or terminal 3) as an amplitude modulated signal, up-converts phase modulated components to a carrier frequency in order to generate an RF modulated signal, and supplies the RF modulated signal to the RF amplifier 30 (or terminal 4). In summary, only the signal output to the RF amplifier by the polar modulator is different between the ET system and the EER system, and the power supply modulator and the RF amplifier may be commonly used in both systems.

Figure 3:
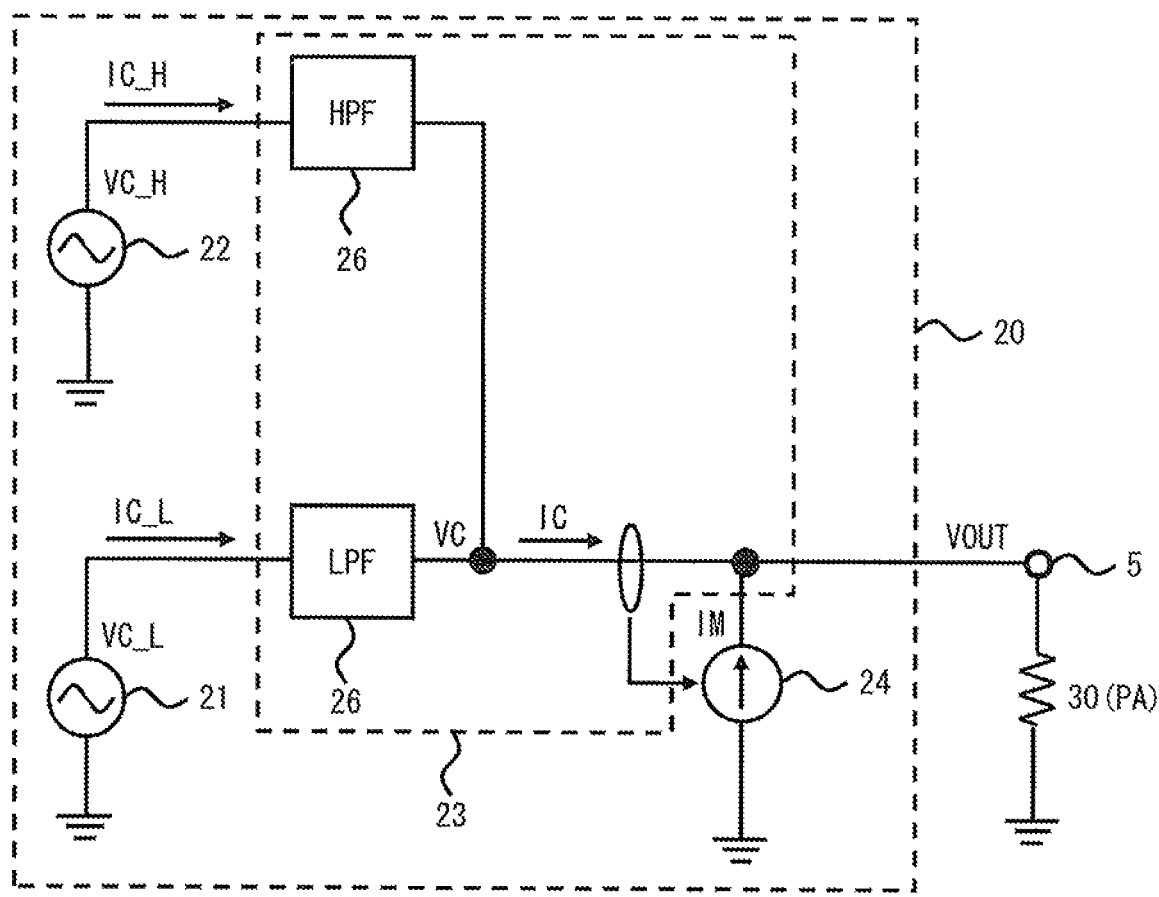
FIG. 3 is a block diagram of a power supply modulator according to the first exemplary embodiment.

Next, the detail of the power supply modulator 20 according to the first exemplary embodiment will be described. FIG. 3 shows a block diagram of the power supply modulator 20. As shown in FIG. 3, the power supply modulator 20 includes a first voltage source 21, a second voltage source 22, a combiner circuit 23, and a current source 24.

The first voltage source 21 amplifies low-frequency components of amplitude modulated components of the amplitude modulated signal received from the polar modulator 10 to output a first voltage (e.g., low-frequency amplitude modulated signal VC_L). Further, the first voltage source 21 outputs a low-frequency error current IC_L corresponding to low-frequency components of an error current IC between a current supplied to the RF amplifier 30 and a current output from the current source 24. In the following description, the first voltage source 21 is called low-frequency voltage source. The second voltage source 22 amplifies high-frequency components of the amplitude modulated components of the amplitude modulated signal received from the polar modulator 10 to output a second voltage (e.g., high-frequency amplitude modulated signal VC_H). Further, the second voltage source 22 outputs a high-frequency error current IC_H corresponding to the high-frequency components of the error current IC between the current supplied to the RF amplifier 30 and the current output from the current source 24. In the following description, the second voltage source 22 is called high-frequency voltage source.

The combiner circuit 23 combines the low-frequency amplitude modulated signal VC_L, the high-frequency amplitude modulated signal VC_H, and a current IM output from the current source 24 to generate a modulated power supply signal VOUT, and outputs the modulated power supply signal VOUT to the RF amplifier 30 (or terminal 5). The combiner circuit 23 includes a low pass filter (LPF) 25 and a high pass filter (HPF) 26. A cutoff frequency that determines a passband width is set in each of the low pass filter 25 and the high pass filter 26. In the first exemplary embodiment, these cutoff frequencies are set so that the passband of the low pass filter 25 does not overlap with the passband of the high pass filter 26.

The current source 24 amplifies the amplitude modulated signal, generates a current IM, and outputs the current IM to the combiner circuit 23. In the first exemplary embodiment, the current source 24 detects the amplitude level of an amplitude modulated signal VC obtained by combining the low-frequency amplitude modulated signal VC_L and the high-frequency amplitude modulated signal VC_H by the combiner circuit 23, to generate the current IM according to the voltage level that is detected. At this time, the amplitude modulated signal VC combined in the combiner circuit 23 is equal to the amplitude modulated signal output from the polar modulator 10. Further, a switching regulator is used as the current source 24 according to the first exemplary embodiment.

From the above description, the effect of providing the current source 24 in the power supply modulator 20 according to the first exemplary embodiment is that the current output from the low-frequency voltage source 21 and the high-frequency voltage source 22 is only the error current IC between the current consumed in the RF amplifier 30 and the current IM output from the current source 24. Accordingly, the power consumption in the low-frequency voltage source 21 and the high-frequency voltage source 22 can be reduced. Further, in the power supply modulator 20 according to the first exemplary embodiment, the voltage source includes the low-frequency voltage source 21 where high-voltage output is required, and the high-frequency voltage source 22 where low-voltage output and high-speed operation are required. Now, the current output from the current source 24 has characteristics that it accurately follows low-frequency components and does not accurately follow high-frequency components. This is because, since the switching regulator (current source 24) outputs high current, it is formed by using a transistor which is too large to perform high-speed switching operation. From the above description, the low-frequency error current IC_L of the error current IC is quite smaller than the high-frequency error current IC_H. Accordingly, in the power supply modulator 20 according to the first exemplary embodiment, the low-frequency voltage source 21 has high output voltage and low output current, and the high-frequency voltage source 22 has low output voltage and high output current. In summary, in the power supply modulator 20 according to the first exemplary embodiment, the power consumption is reduced since the voltage source is not required to have characteristics of high output voltage and high output current.

Further, the power supply modulator 20 according to the first exemplary embodiment preferably sets the cutoff frequency of the low pass filter 25 below the cutoff frequency of the high pass filter 26, and sets the cutoff frequency of the low pass filter 25 to be close to the cutoff frequency of the high pass filter 26. Accordingly, it is possible to reduce distortion of the amplitude modulated signal VC after combination while preventing a short-circuit current from flowing between the low-frequency voltage source 21 and the high-frequency voltage source 22.

Figure 4:
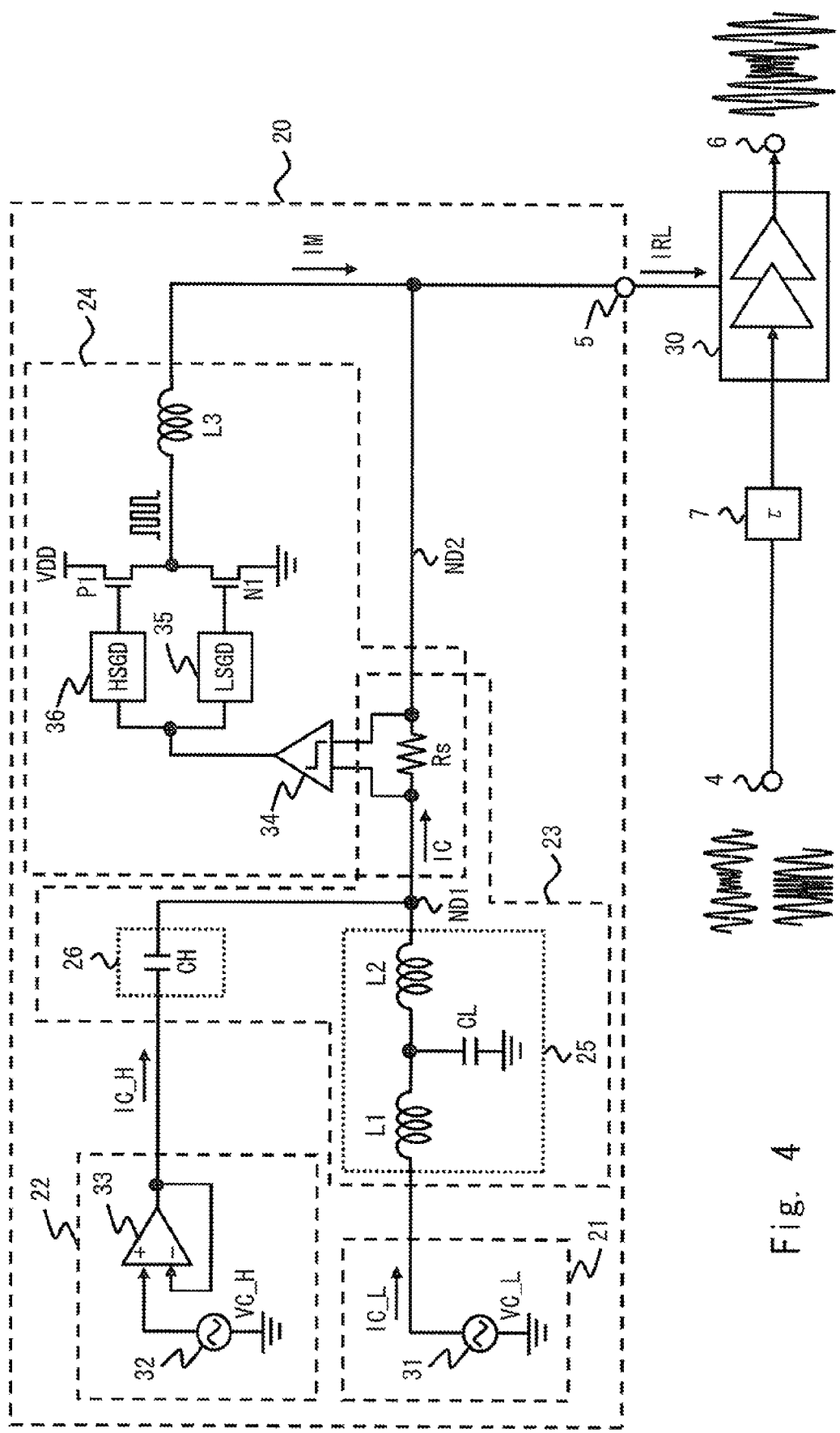
FIG. 4 is a circuit diagram of the power supply modulator according to the first exemplary embodiment.

The power supply modulator 20 that is stated above will be described further in detail. FIG. 4 shows a circuit diagram of the power supply modulator 20. Note that the parts shown in FIG. 4 corresponding to the block diagram of FIG. 3 are denoted by the same reference symbols as FIG. 3, and the description of the functions of the blocks will be omitted. Further, although a delay circuit 7 is inserted in the former stage of the RF amplifier 30 in FIG. 4, this delay circuit 7 cancels the error between the operation of the power supply modulator 20 and the RF modulated signal. The delay caused by the delay circuit 7 may be generated inside the polar modulator 10.

The low-frequency voltage source 21 includes a low-frequency signal source 31. The low-frequency signal source 31 extracts low-frequency components from the amplitude modulated signal output from the polar modulator 10, and outputs the low-frequency amplitude modulated signal VC_L. Further, the low-frequency signal source 31 outputs the low-frequency error current IC_L corresponding to low-frequency components of the error current IC.

The high-frequency voltage source 22 includes a high-frequency signal source 32 and a buffer circuit 33. The high-frequency signal source 32 extracts high-frequency components from the amplitude modulated signal output from the polar modulator 10, and outputs the high-frequency amplitude modulated signal VC_H. The buffer circuit 33 outputs the high-frequency amplitude modulated signal VC_H output from the high-frequency signal source 32, and outputs the high-frequency error current IC_H corresponding to the high-frequency components of the error current IC.

In the first exemplary embodiment, the buffer circuit 33 formed of a voltage follower circuit is provided in the side of the high-frequency voltage source 22 in order to reduce output impedance in the high-frequency band.

The combiner circuit 23 includes the low pass filter 25, the high pass filter 26, and a resistor Rs. The low pass filter 25 is connected between the output of the low-frequency voltage source 21 and a voltage combiner node ND1. The low pass filter 25 includes inductors L1, L2, and a capacitor CL. The inductors L1 and L2 are connected in series between the output of the low-frequency voltage source 21 and the voltage combiner node ND1. The capacitor CL is connected between a ground terminal and a node where the inductors L1 and L2 are connected to each other. The low pass filter 25 only passes the signal having a bandwidth lower than the cutoff frequency determined by the inductors L1 and L2, and the capacitor CL.

The high pass filter 26 includes a capacitor CH. The capacitor CH is provided between the output of the buffer circuit 33 of the high-frequency voltage source 22 and the voltage combiner node ND1. The cutoff frequency in the high pass filter 26 is determined by the capacitance value of the capacitor CH and the output impedance of the buffer circuit 33. The high pass filter 26 allows signals having higher frequency than the cutoff frequency to pass.

Now, in the first exemplary embodiment, the output-side terminal of the low pass filter 25 and the output terminal of the high pass filter 26 are connected to the voltage combiner node ND1. Then, the signal passband of the low pass filter 25 and that of the high pass filter 26 are set so that they do not overlap with each other. In this way, in the voltage combiner node ND1, the low-frequency amplitude modulated signal VC_L output from the low-frequency voltage source 21 and the high-frequency amplitude modulated signal VC_H output from the high-frequency voltage source 22 are combined, which generates the amplitude modulated signal VC. Further, in the voltage combiner node ND1, the low-frequency error current IC_L output from the low-frequency voltage source 21 and the high-frequency error current IC_H output from the high-frequency voltage source 22 are combined, which generates the error current IC.

The resistor Rs is provided between the voltage combiner node ND1 and a voltage current combiner node ND2. The resistor Rs allows the error current IC input from one end (in the side of the voltage combiner node ND1) to pass, and combines the error current IC and the current IM supplied from the current source 24 by the other terminal (in the side of the voltage current combiner node ND2). A combined current IRL is then supplied to the RF amplifier 30 through the terminal 5. Further, the amplitude modulated signal VC combined in the voltage combiner node ND1 is output to the terminal 5 through the resistor Rs. The voltage output to the terminal 5 corresponds to the modulated power supply signal VOUT of FIG. 3.

The current source 24 is made up of a switching regulator. This switching regulator detects the magnitude of the error current IC generated by the amplitude of the amplitude modulated signal VC by the resistor Rs, and generates the current IM corresponding to the amplitude modulated signal VC. More specifically, the current source 24 includes the resistor Rs, a pulse modulator 34, a low-side gate driver 35, a high-side gate driver 36, a first switching element (e.g., PMOS transistor P1), a second switching element (e.g., NMOS transistor N1), and an inductor element (e.g., inductor L3).

The resistor Rs is commonly used with the combiner circuit 23, and detects the magnitude of the error current IC. The pulse modulator 34 generates a pulse modulated signal based on the voltage difference generated at both ends of the resistor Rs based on the error current IC. The low-side gate driver 35 drives the NMOS transistor N1 based on the pulse modulated signal. The high-side gate driver 36 drives the PMOS transistor P1 based on the pulse modulated signal. The PMOS transistor P1 and the NMOS transistor N1 are connected in series between a direct current power supply terminal VDD and a ground terminal. One end of the inductor L3 is connected to an output terminal (or connection node) where the PMOS transistor P1 and the NMOS transistor N1 are connected to each other. The other end of the inductor L3 is connected to the terminal 5. Note that the direct current power supply is connected to the power supply terminal VDD.

The NMOS transistor N1 and the PMOS transistor P1 are controlled to be exclusively conducted by the low-side gate driver 35 and the high-side gate driver 36. In this way, the switching regulator outputs a signal obtained by amplifying the pulse modulated signal to one end of the inductor L3. Further, the switching regulator controls a current output from the direct current power supply terminal to the inductor L3, and a current drawn into the ground terminal from the inductor L3. The inductor L3 serves as a smoothing element. The inductor L3 outputs the current IM to the terminal 5. At this time, in the switching regulator, the current IM is generated to decrease the voltage difference at the both ends of the resistor Rs by the feedback path through the resistor Rs. In summary, the current source 24 varies the magnitude of the current IM according to the voltage of the amplitude modulated signal VC, to decrease the error current IC between the current IM and the current IRL supplied to the RF amplifier 30. Further, the current IM accurately tracks the low-frequency components of the amplitude modulated signal VC according to the characteristics of the switching regulator.

Figure 5:
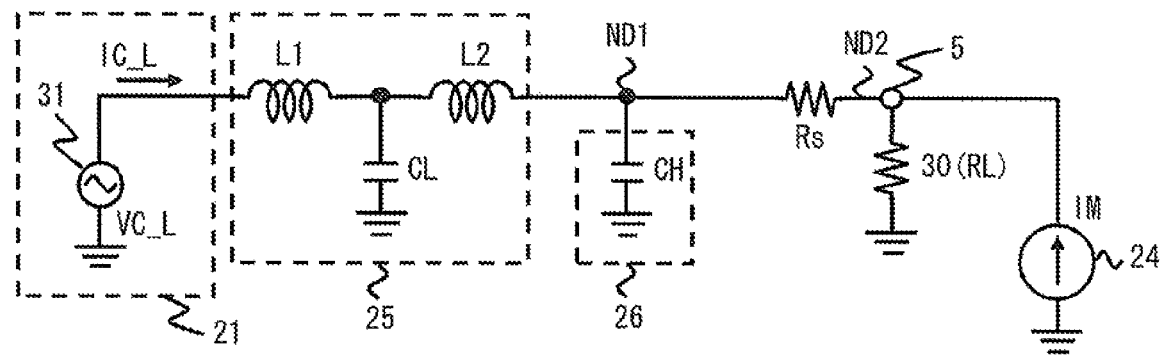
FIG. 5 is an equivalent circuit diagram of a low-frequency voltage source of the power supply modulator according to the first exemplary embodiment.
Figure 6:
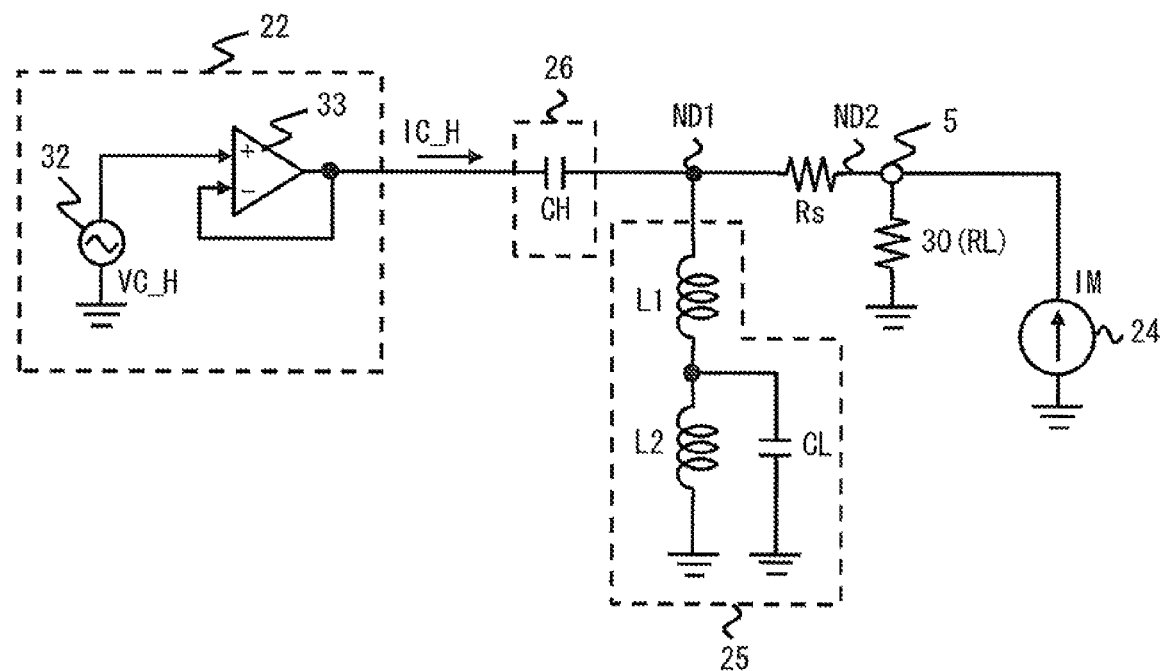
FIG. 6 is an equivalent circuit diagram of a high-frequency voltage source of the power supply modulator according to the first exemplary embodiment.

Now, FIG. 5 shows an equivalent circuit diagram of a circuit connected to the low-frequency voltage source 21, and FIG. 6 shows an equivalent circuit diagram of a circuit connected to the high-frequency voltage source 22. As shown in FIG. 5, the RF amplifier 30 is connected to the low-frequency voltage source 21 as a load. Then, two-stage low pass filters are provided by the inductors L1 and L2 and the capacitor CL of the low pass filter 25, and the capacitor CH of the high pass filter 26 in the path from the low-frequency voltage source 21 to the load. In summary, the low-frequency amplitude modulated signal VC_L output from the low-frequency voltage source 21 is supplied to the load through the two-stage low pass filters. Further, as shown in FIG. 6, the RF amplifier 30 is connected to the high-frequency voltage source 22 as a load. Then, two-stage high pass filters are provided by the capacitor CH of the high pass filter 26, and the inductors L1 and L2 and the capacitor CL of the low pass filter 25 in the path from the high-frequency voltage source 22 to the load. In summary, the high-frequency amplitude modulated signal VC_H output from the high-frequency voltage source 22 is applied to the load through the two-stage high pass filters. In short, the low pass filter 25 and the high pass filter 26 according to the first exemplary embodiment form high-order filters with a few number of elements according to the connection state of the elements that constitute these filters.

The low-frequency signal source 31 and the high-frequency signal source 32 are preferably in synchronized with each other, to set the output timings of the low-frequency amplitude modulated signal VC_L, the high-frequency amplitude modulated signal VC_H, and the pulse signal output from the pulse modulator 34 to a desired value. By setting the output timings of the low-frequency amplitude modulated signal VC_L, the high-frequency amplitude modulated signal VC_H, and the pulse signal output from the pulse modulator 34 to correct the delay difference between the low pass filter 25 and the high pass filter 26, the waveform error generated when combining the low-frequency amplitude modulated signal VC_L and the high-frequency amplitude modulated signal VC_H by the node ND1 can be suppressed.

Figure 7:
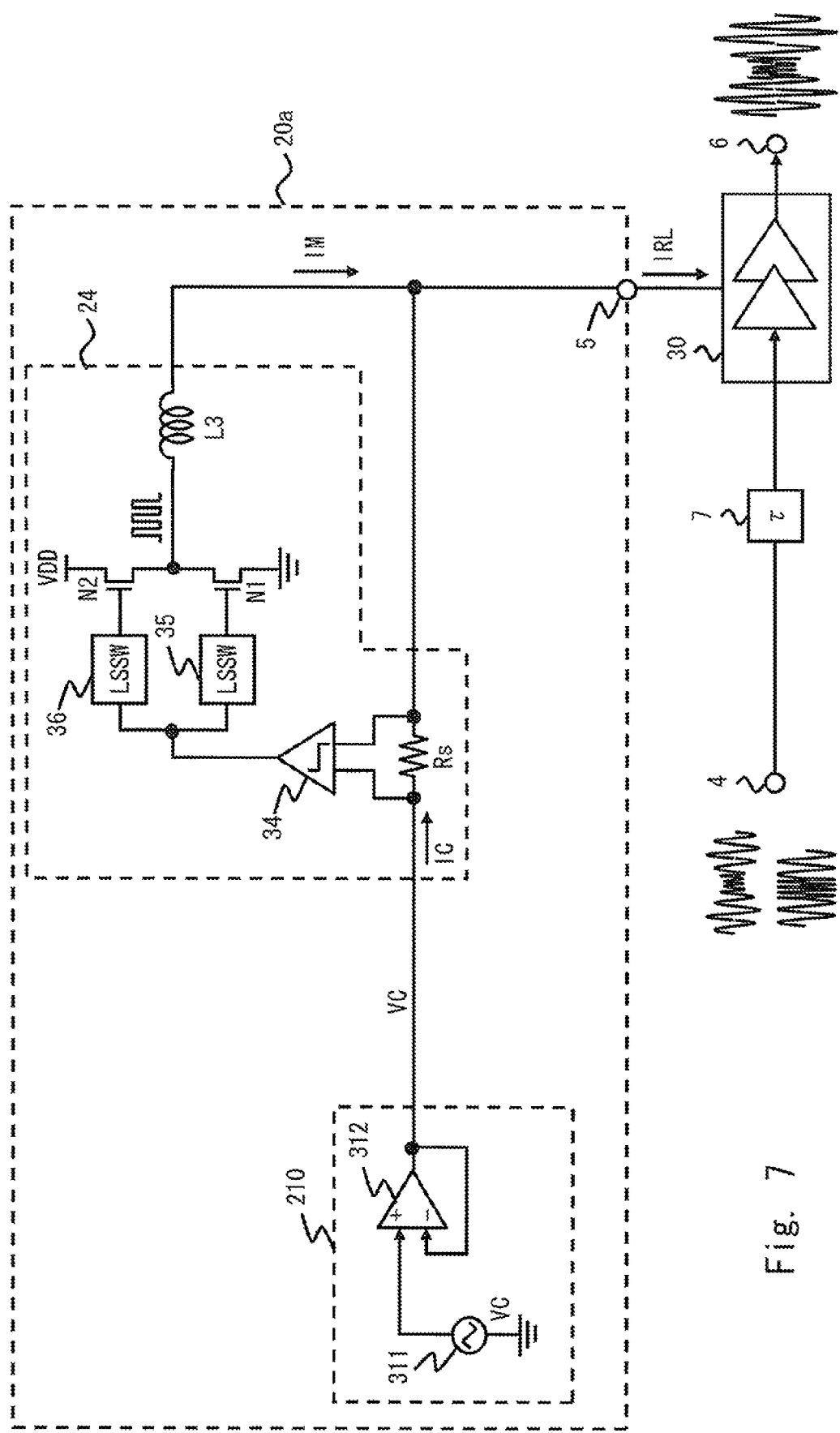
FIG. 7 is a comparative example of the power supply modulator for describing an effect of the power supply modulator according to the first exemplary embodiment.

Subsequently, the effect of reducing power consumption of the power supply modulator 20 according to the first exemplary embodiment will be described. Before starting explanation, a comparative example will be shown in which the power supply modulator 20 includes one voltage source. FIG. 7 shows a block diagram of a power supply modulator 20a which is the comparative example.

In the comparative example shown in FIG. 7, a voltage source 210 is provided in place of the low-frequency voltage source 21 and the high-frequency voltage source 22. Further, since only one voltage source is provided in the comparative example, the low pass filter 25 and the high pass filter 26 are not provided. The voltage source 210 includes a signal source 311 and a buffer circuit 312. The signal source 311 outputs the amplitude modulated signal VC received from the polar modulator 10. The buffer circuit 312 outputs the amplitude modulated signal VC output from the signal source 311 and outputs the error current IC. The buffer circuit 312 serves as an impedance converter of the signal source 311.

Figure 8:
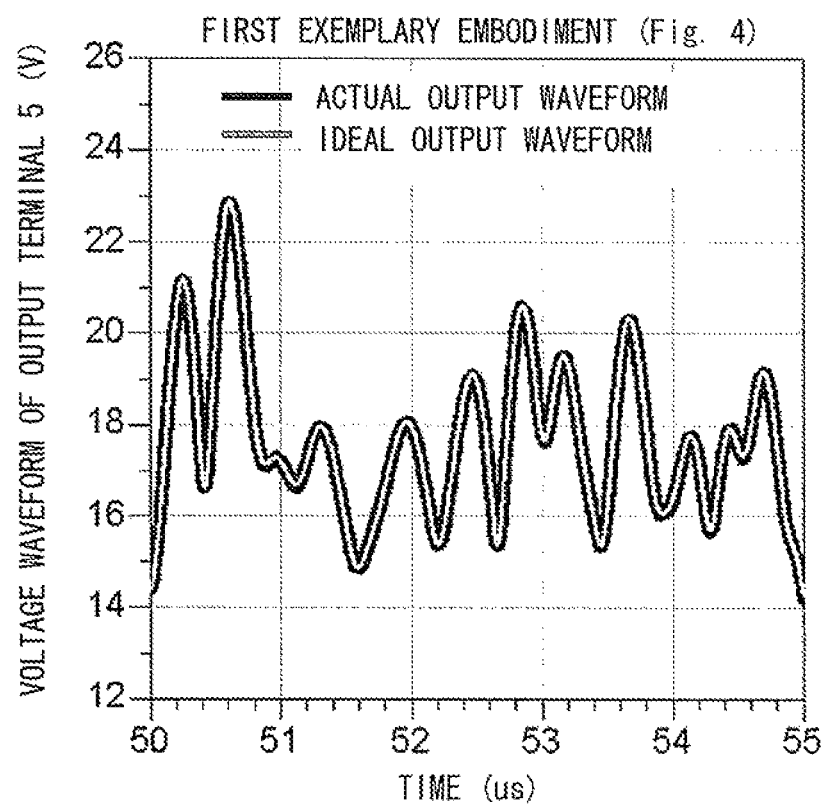
FIG. 8 is a graph showing an output voltage waveform of the power supply modulator according to the first exemplary embodiment.
Figure 9:
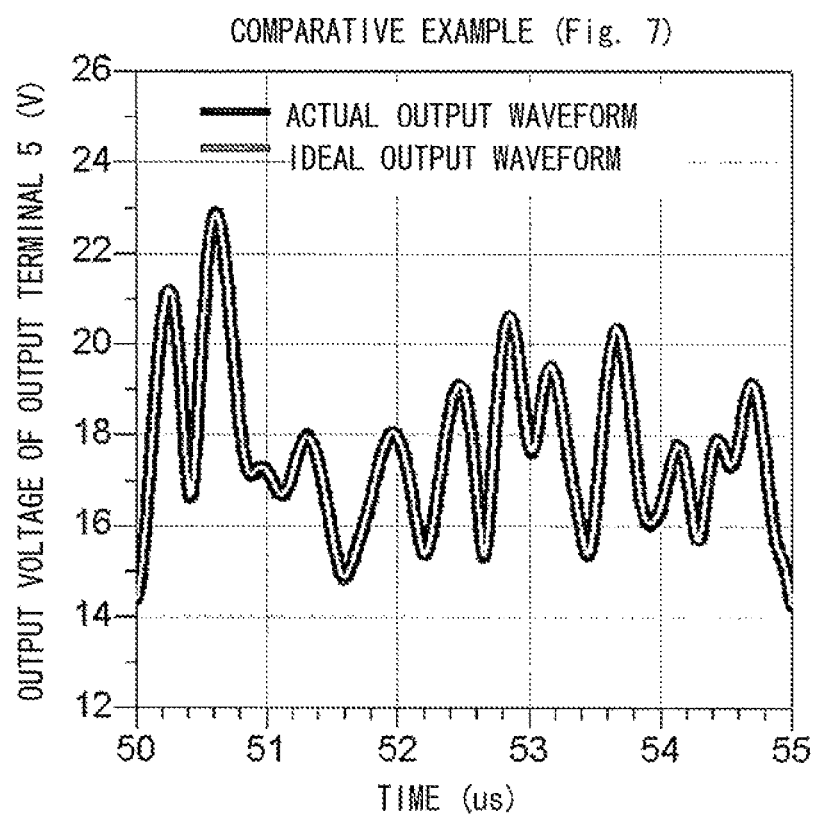
FIG. 9 is a graph showing an output voltage waveform of a comparative example of the power supply modulator according to the first exemplary embodiment.

First, an output voltage waveform of the power supply modulator 20 according to the first exemplary embodiment and an output voltage waveform of the power supply modulator 20a according to the comparative example are compared. FIG. 8 shows a graph of the output voltage waveform of the power supply modulator 20 according to the first exemplary embodiment, and FIG. 9 shows a graph of the output voltage waveform of the power supply modulator 20a according to the comparative example. The output voltage waveforms shown in FIGS. 8 and 9 are simulation results when the power supply modulator 20 and the power supply modulator 20a are operated in the same condition. FIGS. 8 and 9 show that both output voltage waveforms of the power supply modulator 20 and the power supply modulator 20a accurately follow the ideal voltage waveform. It is thus shown that, even when the low pass filter 25 and the high pass filter 26 are inserted into the signal path, the modulated power supply signal can be obtained with the same accuracy as when the filters or the like are not inserted in the power supply modulator 20 according to the first exemplary embodiment. This is due to the fact that the distortion of the amplitude modulated signal VC after combination can be reduced by making the cutoff frequency of the low pass filter 25 close to the cutoff frequency of the high pass filter 26.

Figure 10:
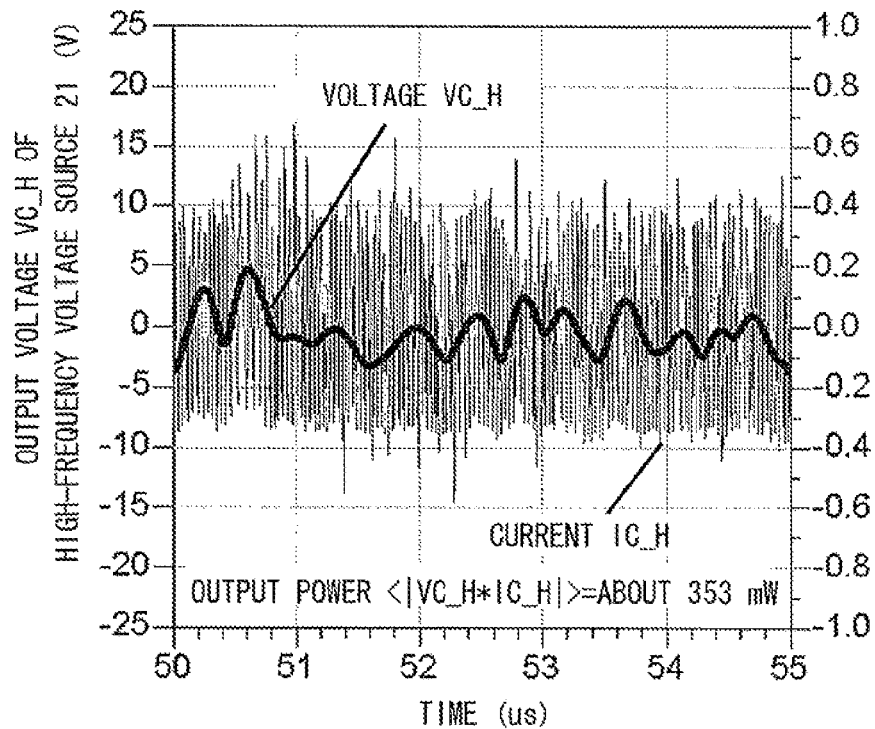
FIG. 10 is graphs showing an output voltage waveform and an output current waveform of the high-frequency voltage source of the power supply modulator according to the first exemplary embodiment.
Figure 11:
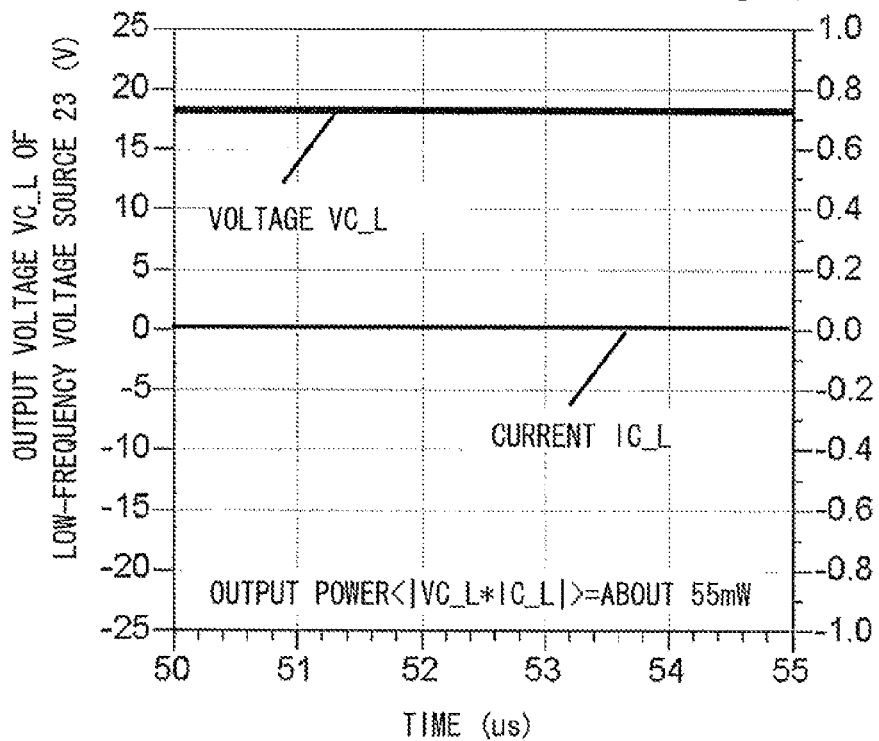
FIG. 11 is graphs showing an output voltage waveform and an output current waveform of the low-frequency voltage source of the power supply modulator according to the first exemplary embodiment.

Subsequently, the power consumption of the power supply modulator 20 according to the first exemplary embodiment and the power consumption of the power supply modulator 20a according to the comparative example are compared. FIG. 10 shows graphs of the high-frequency amplitude modulated signal VC_H and the high-frequency error current IC_H output from the high-frequency voltage source 22 of the power supply modulator 20 according to the first exemplary embodiment, FIG. 11 shows graphs of the low-frequency amplitude modulated signal VC_L and the low-frequency error current IC_L output from the low-frequency voltage source 21 of the power supply modulator 20 according to the first exemplary embodiment, and FIG. 12 shows graphs of the error current IC and the amplitude modulated signal VC output from the voltage source 210 according to the comparative example.

As shown in FIG. 10, the maximum voltage of the high-frequency amplitude modulated signal VC_H is about 5 V, and the average current of the high-frequency error current IC_H is about 200 mA. From this description, the power consumption in the high-frequency voltage source 22 is about 353 mW. Further, as shown in FIG. 11, the maximum voltage of the low-frequency amplitude modulated signal VC_L is about 20 V, and the average current of the high-frequency error current IC_H is several mA. Thus, the power consumption of the low-frequency voltage source 21 is about 55 mW. In summary, in the power supply modulator 20 according to the first exemplary embodiment, the sum of the power consumption of the low-frequency voltage source 21 and the power consumption of the high-frequency voltage source 22 is about 408 mW.

Figure 12:
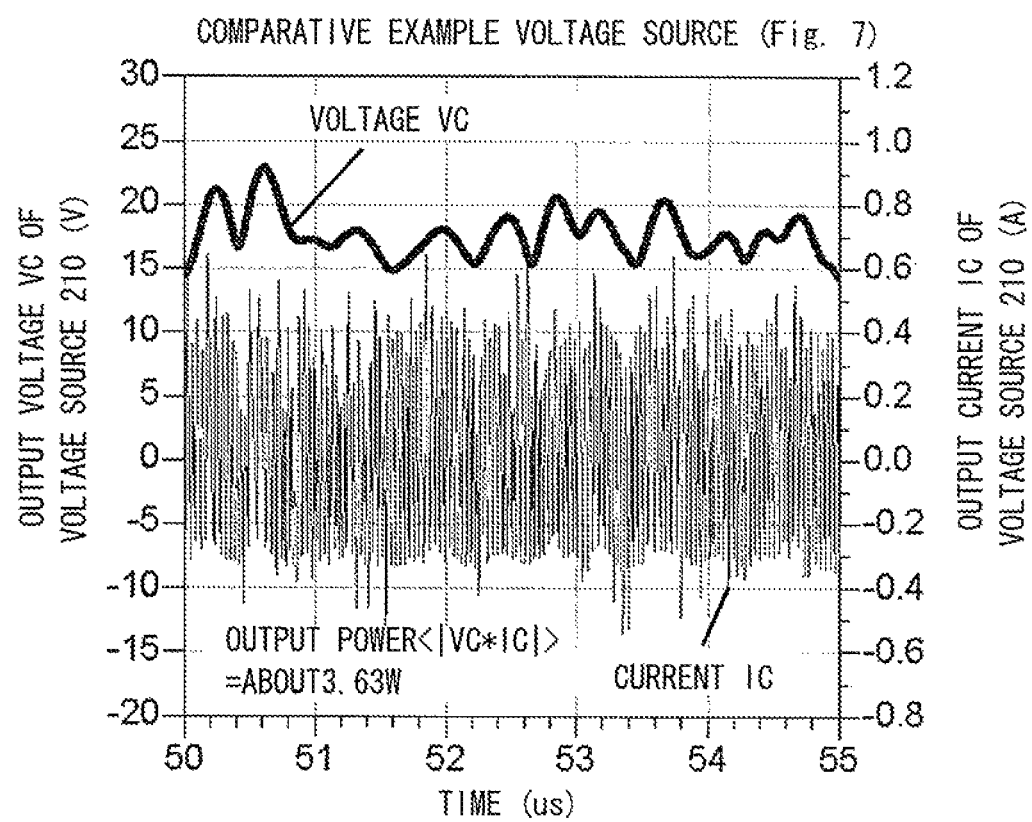
FIG. 12 is graphs showing an output voltage waveform and an output current waveform of a comparative example of the power supply modulator according to the first exemplary embodiment.

On the other hand, as shown in FIG. 12, in the comparative example, the maximum voltage of the amplitude modulated signal VC is about 20 V, and the average current of the error current IC is about 200 mA. Accordingly, the power consumption of the voltage source 210 is about 3.63 W. In summary, the comparative example needs to consume and output nine times as much electric power as that of the power supply modulator 20 according to the first exemplary embodiment.

As described above, the power supply modulator 20 according to the first exemplary embodiment reduces the output power of the voltage source, thereby being capable of greatly reducing power consumption of the voltage source. This is because, since the low-frequency voltage source 21 and the high-frequency voltage source 22 are separated in the power supply modulator 20, the high-frequency error current IC_H which accounts for the great proportion of the error current IC is prevented from being output from the low-frequency voltage source 21 that outputs high voltage. Further, most of the low-frequency current that should be output from the low-frequency voltage source 21 is supplied by the current source 24 as the current IM, whereby the magnitude of the low-frequency error current IC_L output from the low-frequency voltage source 21 can be made close to zero. In summary, the current consumed by the low-frequency voltage source 21 which requires large power consumption in related arts can be greatly reduced by additionally providing the current source 24 and the high-frequency voltage source 22.

Variant Example of First Exemplary Embodiment

Figure 13:
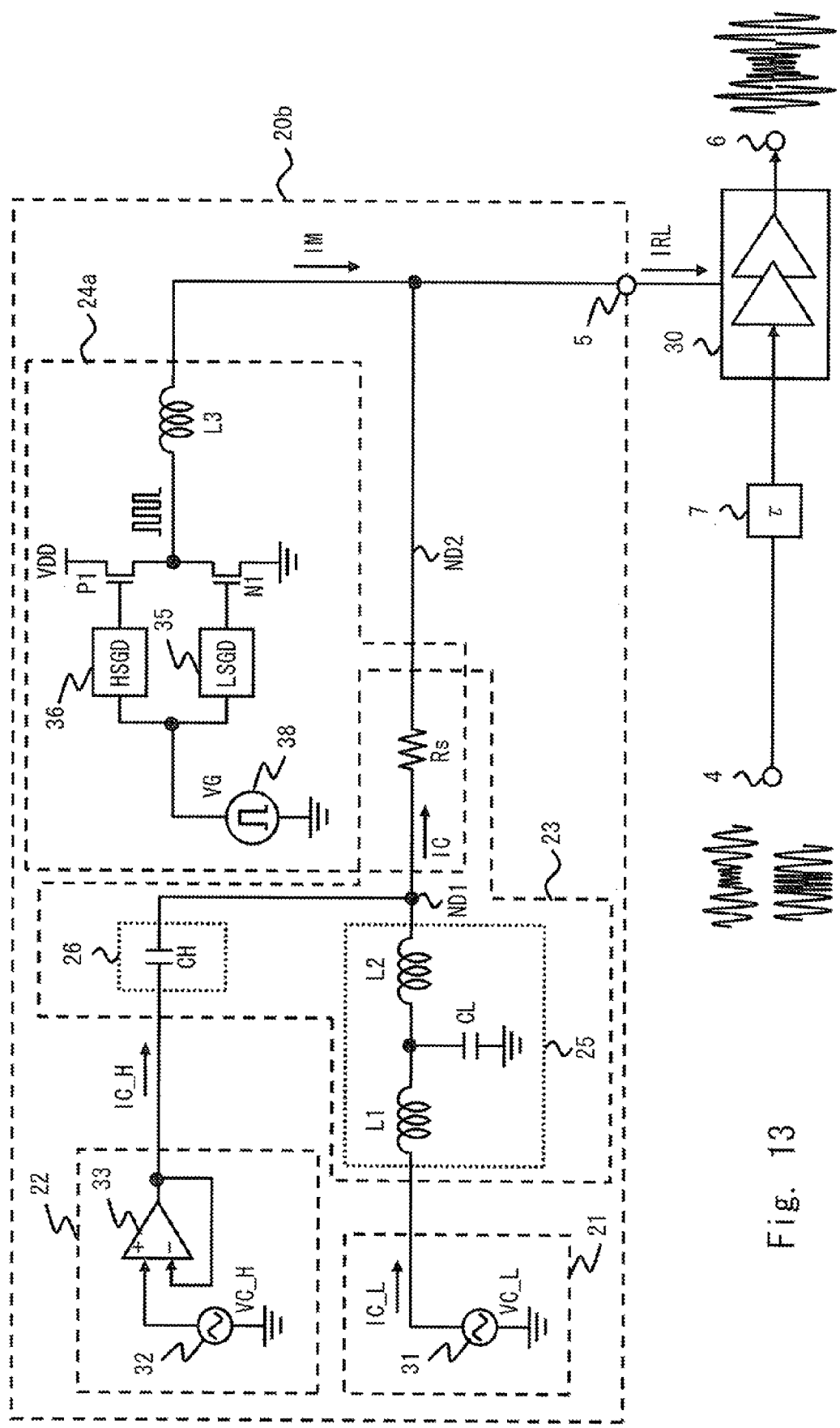
FIG. 13 is a circuit diagram showing a variant example of the power supply modulator according to the first exemplary embodiment.

A power supply modulator 20b according to a variant example of the first exemplary embodiment shown in FIG. 13 will be described. The power supply modulator 20b is used in place of the power supply modulator 20. The power supply modulator 20b includes a current source 24a used in place of the current source 24 of the power supply modulator 20. The current source 24a includes a pulse signal source 38 in place of the pulse modulator 34. The pulse modulator 38 has a function of calculating and outputting a pulse signal VG which is the same to the pulse signal output from the pulse modulator 34 of the power supply modulator 20 in advance. Further, the pulse signal source 38 has a function of setting the output timings of the low-frequency amplitude modulated signal VC_L, the high-frequency amplitude modulated signal VC_H, and the pulse signal VG to a desired value by being synchronized with the low-frequency signal source 31 and the high-frequency signal source 32. In the power supply modulator 20b, the resistor Rs may be removed or short-circuited, or may be implemented.

In this way, by adjusting the output timings of the low-frequency amplitude modulated signal VC_L, the high-frequency amplitude modulated signal VC_H, and the pulse signal VG using the pulse signal source 38 which is synchronized with the low-frequency signal source 31 and the high-frequency signal source 32, it is possible to correct the error caused due to the delay between the current IM output from the current source 24a and the amplitude modulated signal VC output from the combiner circuit 23. By suppressing the error of the current IM and the amplitude modulated signal VC, the error current IC can be suppressed and the power consumption of the low-frequency voltage source 21 and the high-frequency voltage source 22 can be reduced.

Second Exemplary Embodiment

Figure 14:
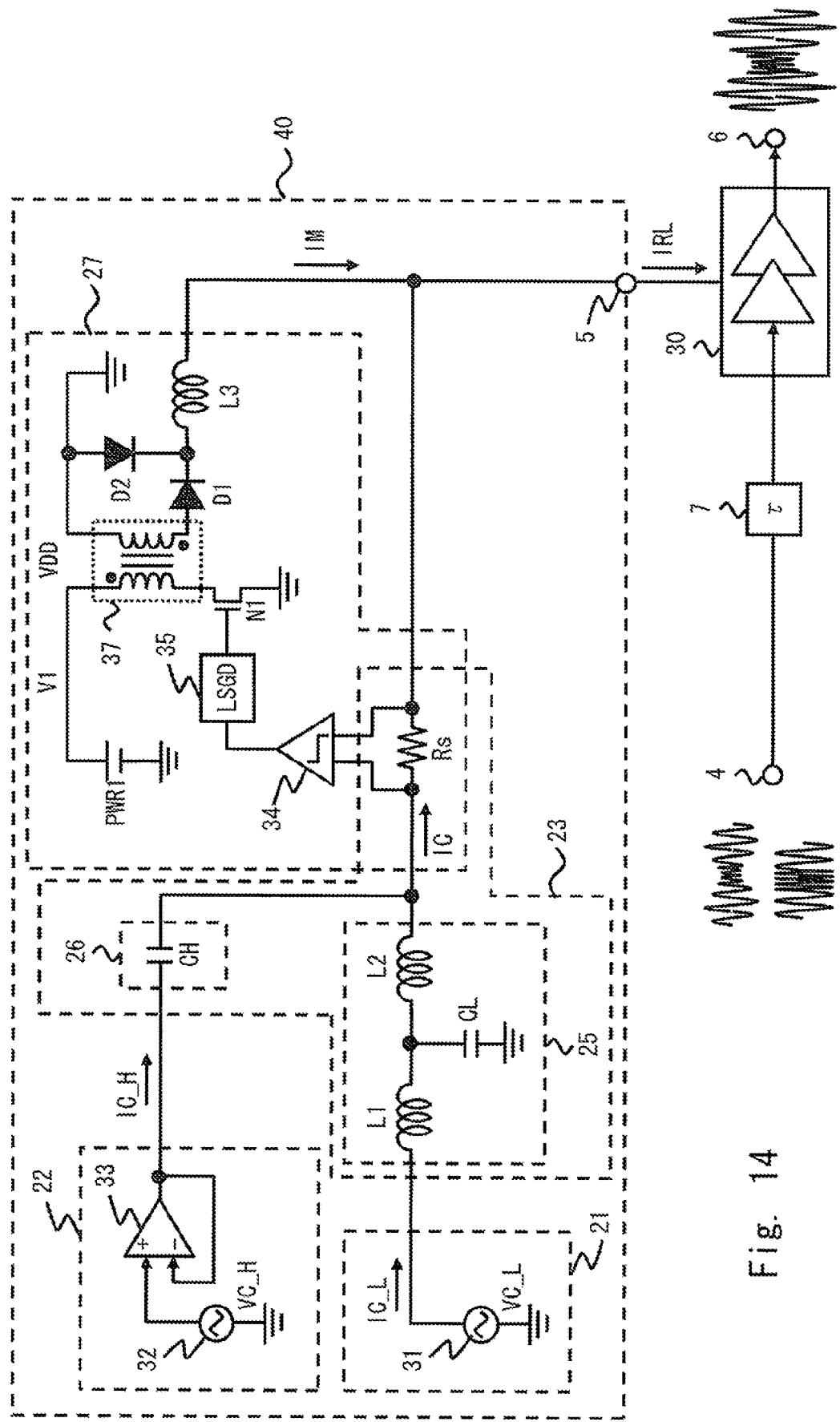
FIG. 14 is a circuit diagram of a power supply modulator according to a second exemplary embodiment.

A power supply modulator 40 according to a second exemplary embodiment shown in FIG. 14 will be described. The power supply modulator 40 is used in place of the power supply modulator 20. Further, the power supply modulator 40 includes a current source 27 in place of the current source 24 of the power supply modulator 20. The current source 27 is a switching regulator using a transformer, the function of which corresponding to the current source 24.

The current source 27 includes a resistor Rs, a pulse modulator 34, a low-side gate driver 35, an NMOS transistor N1, a transformer 37, diodes D1 and D2, an inductor L3, and a direct current power supply PWR1. The resistor Rs is commonly used with the combiner circuit 23, and detects the magnitude of the error current IC. The pulse modulator 34 generates a pulse modulated signal based on a voltage difference generated at both ends of the resistor Rs based on the error current IC. The low-side gate driver 35 drives the NMOS transistor N1 based on the pulse modulated signal. One end of a primary side coil of the transformer 37 is connected to the drain of the NMOS transistor N1, and the other end of the primary side coil is connected to the direct current power supply PWR1. One end of a secondary side coil of the transformer 37 is connected to the ground terminal, and the other end of the secondary side coil is connected to the anode of the diode D1. The cathode of the diode D1 is connected to one end of the inductor L3. The other end of the inductor L3 is connected to the terminal 5. The anode of the diode D2 is connected to the ground terminal, and the cathode thereof is connected to the connection point of one end of the inductor L3 and the cathode of the diode D1. Note that the direct current power supply PWR1 outputs a direct current voltage V1.

As stated above, by using the transformer 37 in the power amplification unit of the switching regulator, the PMOS transistor P1 and the high-side gate driver 36 used in the current source 24 of the first exemplary embodiment can be eliminated. Since the switching regulator outputs high voltage, high voltage is applied to the PMOS transistor P1 from the direct current power supply. However, since the transistor to which high voltage is applied becomes unnecessary by using the transformer 37 as the current source 24 of the second exemplary embodiment, the possibility of breakdown due to the high voltage operation of the transistor can be suppressed. In summary, the current source 27 is able to secure reliability higher than that of the current source 24 of the first exemplary embodiment.

Variant Example of Second Exemplary Embodiment

Figure 15:
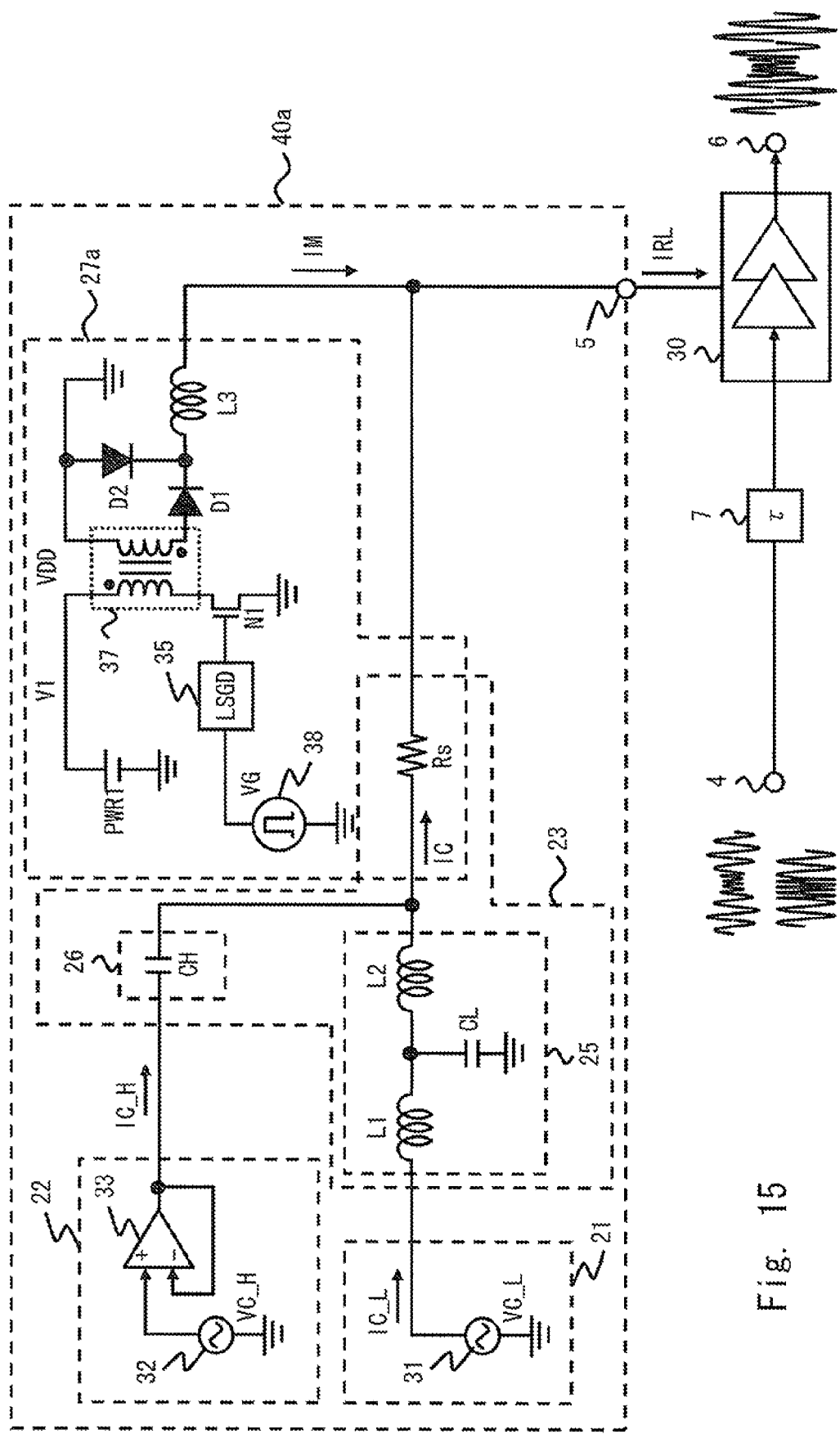
FIG. 15 is a circuit diagram showing a variant example of the power supply modulator according to the second exemplary embodiment.

A power supply modulator 40a according to a variant example of the second exemplary embodiment shown in FIG. 15 will be described. The power supply modulator 40a is used in place of the power supply modulator 40. The power supply modulator 40a includes a current source 27a used in place of the current source 27 of the power supply modulator 40. The current source 27a includes a pulse signal source 38 in place of the pulse modulator 34. In the power supply modulator 40a, the resistor Rs may be removed or short-circuited, or may be implemented.

Also in the variant example of the second exemplary embodiment, as is similar to the variant example of the first exemplary embodiment, the output timings of the low-frequency amplitude modulated signal VC_L, the high-frequency amplitude modulated signal VC_H, and the pulse signal VG are adjusted, thereby being capable of correcting the error caused by the delay of the current IM and the amplitude modulated signal VC, and suppressing power consumption by the low-frequency voltage source 21 and the high-frequency voltage source 22.

Third Exemplary Embodiment

Figure 16:
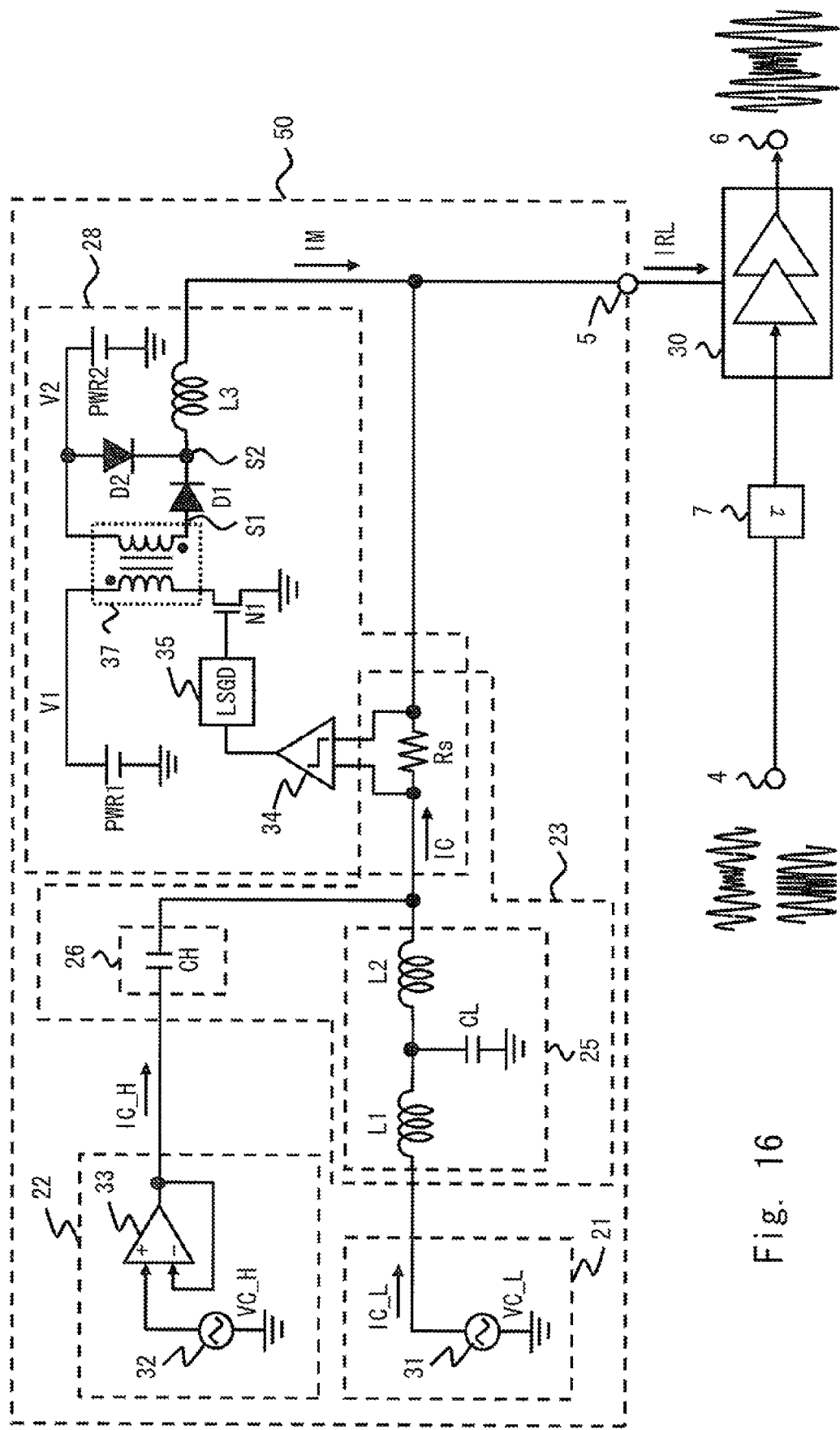
FIG. 16 is a circuit diagram of a power supply modulator according to a third exemplary embodiment.

A power supply modulator 50 according to a third exemplary embodiment shown in FIG. 16 will be described. The power supply modulator 50 is used in place of the power supply modulator 20. Further, the power supply modulator 50 includes a current source 28 in place of the current source 24 of the power supply modulator 20. The current source 28 is a switching regulator using a transformer, as is similar to the current source 27 according to the second exemplary embodiment, and the function of the current source 28 corresponds to that of the current source 24.

The current source 27 includes a resistor Rs, a pulse modulator 34, a low-side gate driver 35, an NMOS transistor N1, a transformer 37, diodes D1 and D2, an inductor L3, a first direct current power supply PWR1, and a second direct current power supply PWR2. The resistor Rs is commonly used with the combiner circuit 23, and detects the magnitude of the error current IC. The pulse modulator 34 generates a pulse modulated signal based on a voltage difference generated at both ends of the resistor Rs based on the error current IC. The low-side gate driver 35 drives the NMOS transistor N1 based on the pulse modulated signal. One end of a primary side coil of the transformer 37 is connected to the drain of the NMOS transistor N1, and the other end of the primary side coil is connected to the first direct current power supply PWR1. One end of a secondary side coil of the transformer 37 is connected to the second direct current power supply PWR2, and the other end of the secondary side coil is connected to the anode of the diode D1. The cathode of the diode D1 is connected to one end of the inductor L3. The other end of the inductor L3 is connected to the terminal 5. The anode of the diode D2 is connected to the second direct current power supply PWR2, and the cathode thereof is connected between one end of the inductor L3 and the cathode of the diode D1. Note that the first direct current power supply PWR1 outputs a direct current voltage V1, and the second direct current power supply PWR2 outputs a direct current voltage V2.

Figure 17:
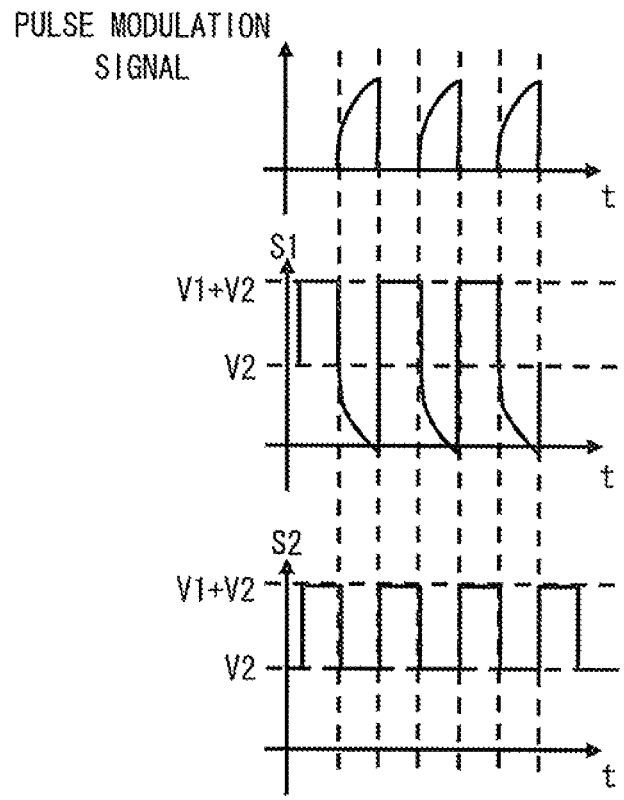
FIG. 17 is a graph showing a pulse modulated signal of a current source according to the third exemplary embodiment.

In the current source 28, the diodes D1 and D2 add the direct current voltage V2 output from the second direct current power supply PWR2 to a signal S1 output from the secondary side coil of the transformer 37 to output the calculation result to the inductor L3. In summary, the diodes D1 and D2 operate as the combiner circuit s to add the direct current voltage V2 output from the second direct current power supply PWR2 to a signal S2 to output the calculation result. Note that the signal S2 input to the inductor L3 is as shown in a waveform shown in FIG. 17.

The inductor L3 smoothes the pulse signal supplied as the signal S2, removes spurious components, and supplies the current IM to the RF amplifier 30.

Figure 18:
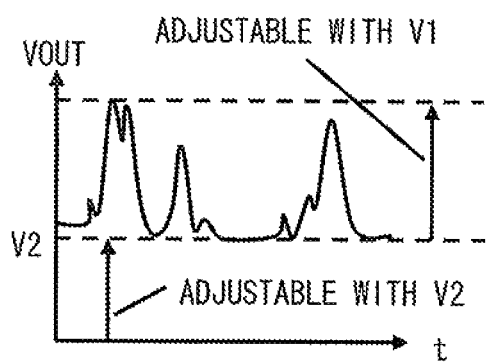
FIG. 18 is a graph showing a modulated power supply signal output from the power supply modulator according to the third exemplary embodiment.
Figure 16:
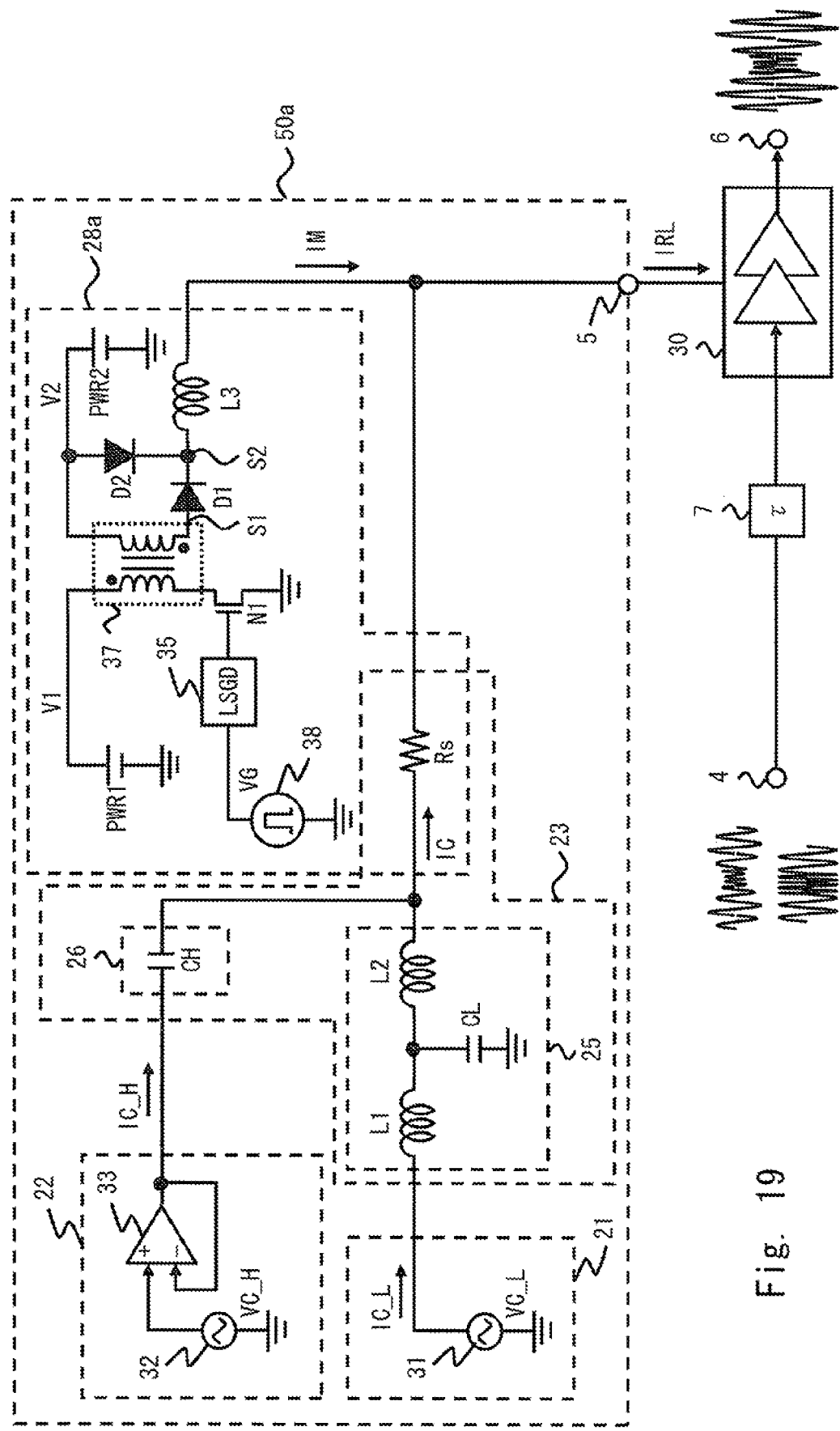
Figure 20:
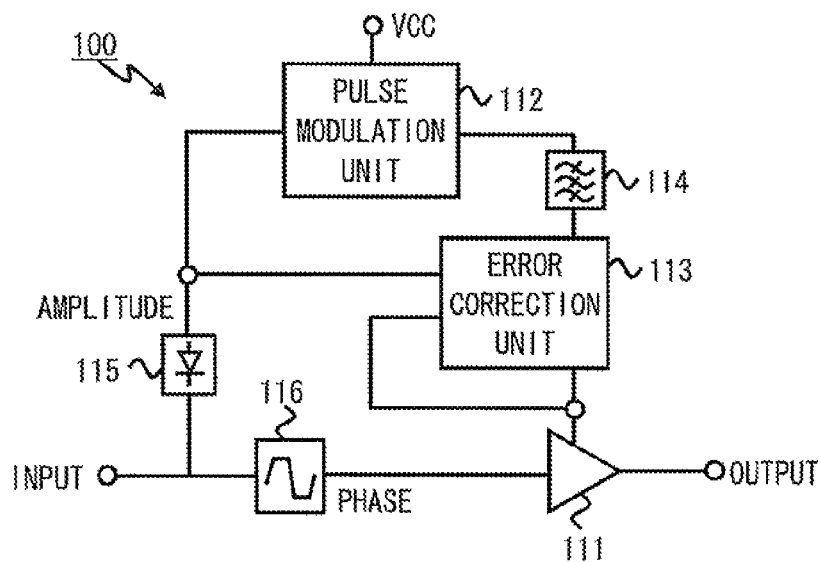
FIG. 20 is a block diagram of a power amplifier disclosed in Patent literature 1.
Figure 21:
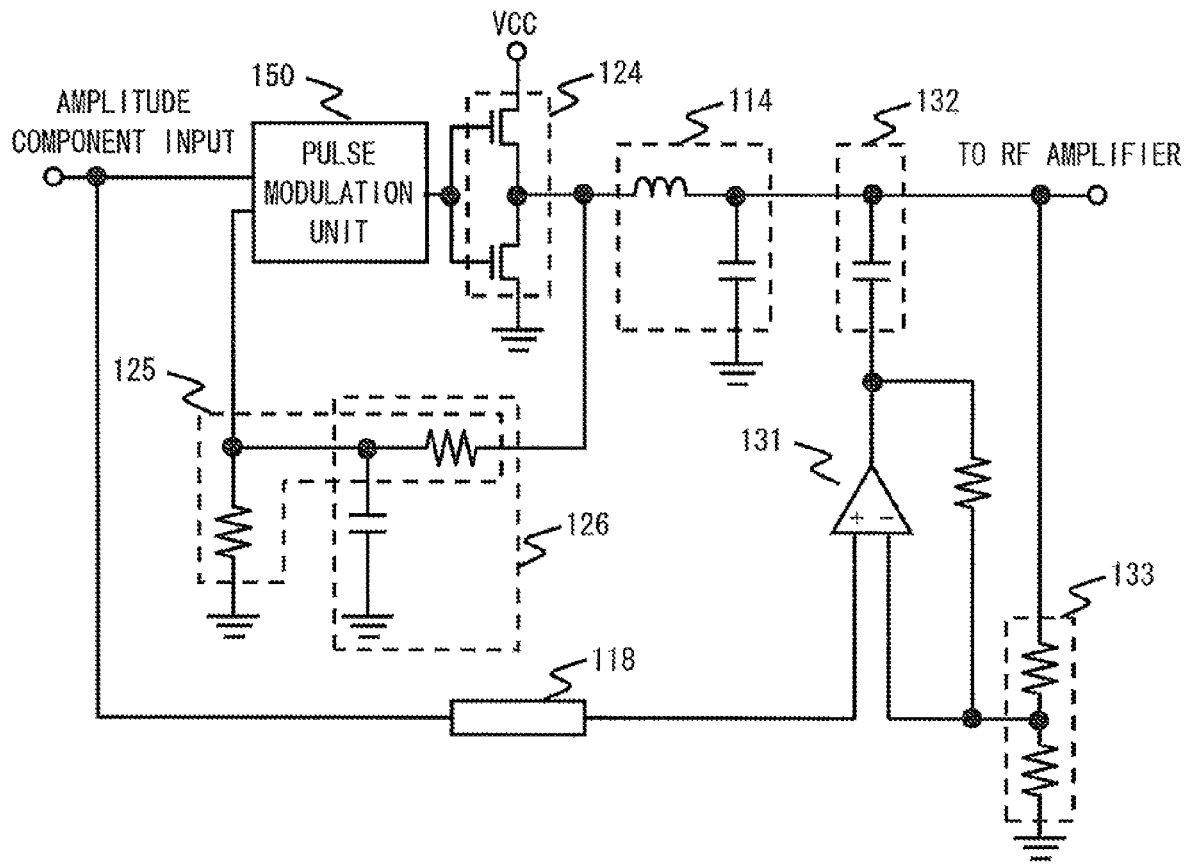
FIG. 21 is a circuit diagram of a pulse modulator, a filter, and an error correction circuit disclosed in Patent literature 1.
Figure 22:
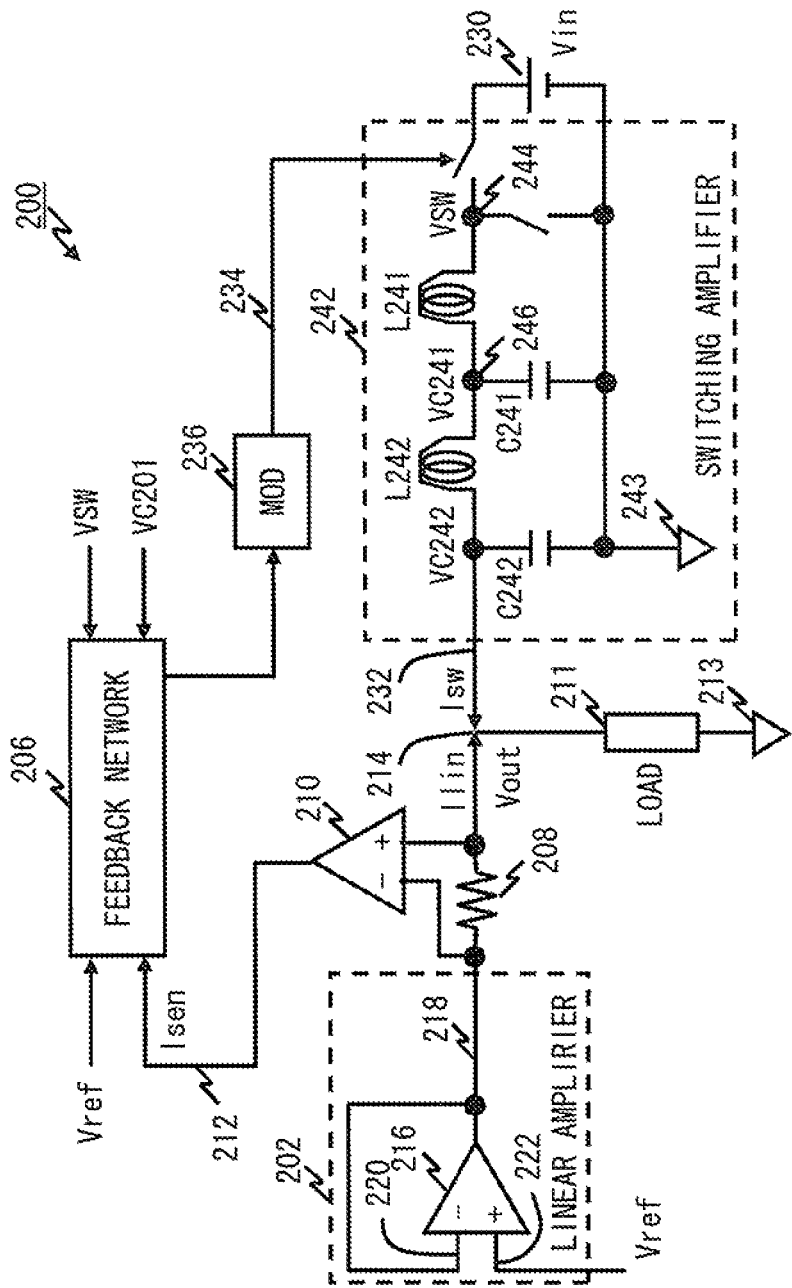
FIG. 22 is a circuit diagram of a power amplifier disclosed in Patent literature 2.
Figure 23:
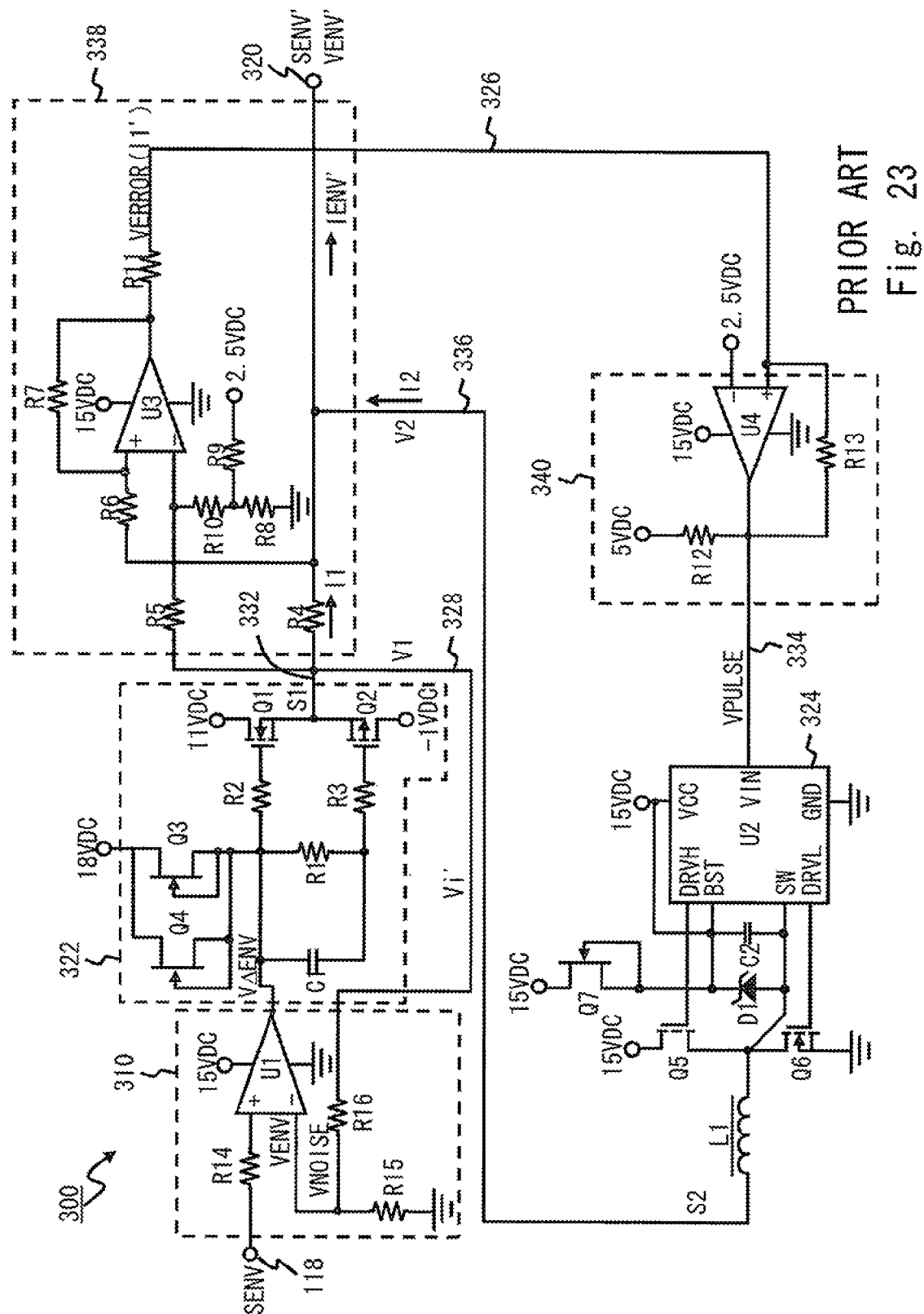
FIG. 23 is a circuit diagram of a power amplifier disclosed in Patent literature 3.
Figure 24:
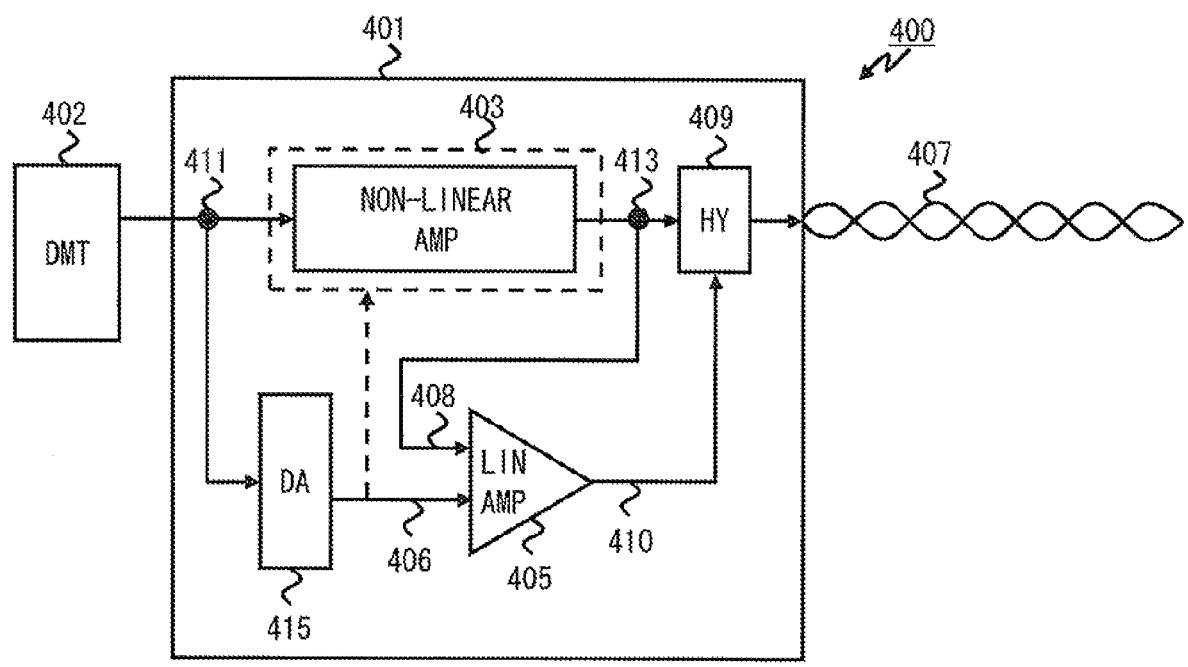
FIG. 24 is a circuit diagram of a power amplifier disclosed in Patent literature 4.

As shown in FIG. 18, the power amplifier according to the third exemplary embodiment amplifies the amplitude modulated signal VC with the gain proportional to the direct current voltage V1 output from the first direct current power supply PWR1, and adds the direct current voltage V2 output from the second direct current power supply PWR2 to the amplified signal, to generate the modulated power supply signal VOUT. This modulated power supply signal VOUT is supplied to the power supply terminal 5 of the RF amplifier 30. Therefore, the amplitude of the output signal of the RF amplifier 30 is modulated by the modulated power supply signal VOUT.

Now, the modulated power supply signal VOUT supplied to the RF amplifier 30 as the power supply voltage is the signal that is limited so as not to be below the direct current voltage V2 output from the second direct current power supply PWR2, which suppresses distortion generated at the output signal of the RF amplifier 30 when the voltage of the modulated power supply signal VOUT is reduced.

The main factor of the power loss in the power supply modulator 50 is the switching loss in the NMOS transistor N1, and the diodes D1 and D2. The switching loss LSW of the NMOS transistor N1 is expressed by formula (1):

$$LSW = \frac{1}{6R} fsw \times \Delta t \times V1^2 \qquad (1)$$

where R is an impedance of a load of the RF amplifier 30, fsw is an average switching frequency of the pulse modulated signal output from the pulse modulator 34, and Δt is the total switching time at the time of ON and OFF.

Further, the switching loss Ld1 of the diode D1 is expressed by formula (2).

$$Ld1 = \frac{1}{6R} fsw \times \Delta t \times V1(V1+V2) \qquad (2)$$

Meanwhile, the switching loss Ld2 of the diode D2 is expressed by formula (3).

$$Ld1 = \frac{1}{6R} fsw \times \Delta t \times V1 \times V2 \qquad (3)$$

Accordingly, the total power loss L of the power supply modulator 410 is shown by the following formula (4).

$$Ltotal = \frac{1}{3R} fsw \times \Delta t \times V1(V1+V2) \qquad (4)$$

Meanwhile, the power Pout output from the power supply modulator 410 is shown by the following formula (5):

$$Pout = d\frac{(V1+V2)^2}{R} + (1-d)\frac{V1^2}{R} \qquad (5)$$

where d is an average duty of the pulse modulated signal.

Accordingly, the ratio Pout/Ltotal of the output power Pout of the power supply modulator 50 shown by the formula (5) to the power loss Ltotal shown by the formula (4) is expressed by formula (6):

$$\frac{Pout}{Ltotal} = \frac{3}{fsw \times \Delta t}\left[(2d+1)r + \frac{1-d}{r+1} - 1\right] \qquad (6)$$

where r=V2/V1 (>0).

As will be seen from the formula (6), Pout/Ltotal is a function that monotonically increases in proportion to the value of r. Further, as shown in formula (7), the power efficiency η is a function that monotonically increases in proportion to the value of out/Ltotal. Accordingly, the power efficiency η is a function that monotonically increases in proportion to the value of r.

$$\eta = \frac{Pout}{Pout + Ltotal} = \frac{1}{1+(Pout/Ltotal)^{-1}} \qquad (7)$$

In summary, the power amplifier according to the third exemplary embodiment has a configuration in which the value of r is increased by supplying the direct current voltage V2 to diodes D1 and D2 from the second direct current power supply PWR2. Accordingly, the power amplifier according to the third exemplary embodiment is able to improve the power efficiency η.

For example, it is verified by an experiment that the power efficiency of the power supply modulator 40 (second exemplary embodiment) when there is no second direct current power supply PWR2 (V2=0 V) is 50 to 70%, and the power efficiency of the power supply modulator 50 when using the second direct current power supply PWR2 (V2=5 V to 10 V) is improved to be 85 to 95%.

Note that the power efficiency of the whole power amplifier according to the third exemplary embodiment mainly depends on the power efficiency of the power supply modulator 50 and the power efficiency of the RF amplifier 30, and is shown by (power efficiency of the power supply modulator 50)×(power efficiency of the RF amplifier 30). The power efficiency of the power supply modulator 50 is, as described above, 50 to 70% when the output voltage V2 of the second direct current power supply PWR2 is 0 V, and is improved to 85 to 95% when V2 is set to 5 to 10 V. Meanwhile, the power efficiency of the RF amplifier 30 typically decreases with increasing value of the output voltage V2 of the second direct current power supply PWR2. Accordingly, in the power amplifier according to the third exemplary embodiment, the value of the direct current voltage V2 output from the second direct current power supply PWR2 is set so that the power efficiency improved by the power supply modulator 50 becomes higher than the power efficiency decreased by the RF amplifier 30, thereby capable of improving the power efficiency of the whole power amplifier.

Variant Example of Third Exemplary Embodiment

A power supply modulator 50a according to a variant example of the third exemplary embodiment shown in FIG. 19 will be described. The power supply modulator 50a is used in place of the power supply modulator 50. The power supply modulator 50a includes a current source 28a in place of the current source 28 used in the power supply modulator 50. The current source 28a includes a pulse signal source 38 in place of the pulse modulator 34. The register Rs may be removed and short-circuited in the power supply modulator 50a, or may be implemented.

Also in the variant example according to the third exemplary embodiment, the output timings of the low-frequency amplitude modulated signal VC_L, the high-frequency amplitude modulated signal VC_H, and the pulse signal VG are adjusted as is similar to the variant example of the first exemplary embodiment, whereby the error caused due to the delay of the current IM and the amplitude modulated signal VC can be corrected, and the power consumption of the low-frequency voltage source 21 and the high-frequency voltage source 22 can be suppressed.

Note that the present invention is not limited to the exemplary embodiments stated above, but can be changed as appropriate without departing from the spirit of the present invention. For example, while the exemplary embodiments stated above can improve the power efficiency by using a switching regulator as a current source of a power supply modulator, the effect of improvement of the power efficiency of the voltage source (including the low-frequency voltage source 21 and the high-frequency voltage source 22) is not impaired even when a linear regulator is used as the current source.

This application is the National Phase of PCT/JP2010/000457, filed Jan. 27, 2010, which claims the benefit of priority, and incorporates herein by reference in its entirety, the following Japanese Patent Application No. 2009-024691 filed on Feb. 5, 2009.

INDUSTRIAL APPLICABILITY

The present invention is applicable to transmission power amplifiers used for radio communication devices.

| | Reference Signs List |
|---|---|
| 1, 1A | POWER AMPLIFIER |
| 2 | INPUT TERMINAL |
| 3-5 | TERMINAL |
| 6 | OUTPUT TERMINAL |
| 7 | DELAY CIRCUIT |
| 10, 10A | POLAR MODULATOR |
| 20, 20A, 20B, 40, 40A, 50, 50A | POWER SUPPLY MODULATOR |
| 21 | LOW-FREQUENCY VOLTAGE SOURCE |
| 22 | HIGH-FREQUENCY VOLTAGE SOURCE |
| 23 | COMBINER CIRCUIT |
| 24, 24A, 27, 27A, 28, 28A | CURRENT SOURCE |
| 25 | LOW PASS FILTER |
| 26 | HIGH PASS FILTER |
| 30 | RF AMPLIFIER |
| 31 | LOW-FREQUENCY SIGNAL SOURCE |
| 32 | HIGH-FREQUENCY SIGNAL SOURCE |
| 33 | BUFFER CIRCUIT |
| 34 | PULSE MODULATOR |
| 35 | LOW-SIDE GATE DRIVER |
| 36 | HIGH-SIDE GATE DRIVER |
| 37 | TRANSFORMER |
| 38 | PULSE SIGNAL SOURCE |
| 210 | VOLTAGE SOURCE |
| 311 | SIGNAL SOURCE |
| 312 | BUFFER CIRCUIT |
| CH, CL | CAPACITOR |
| D1, D2 | DIODE |
| L1 to L3 | INDUCTOR |
| N1 | NMOS TRANSISTOR |
| ND1 | VOLTAGE COMBINER NODE |
| ND2 | VOLTAGE CURRENT COMBINER NODE |
| P1 | PMOS TRANSISTOR |
| PWR1, PWR2 | DIRECT CURRENT POWER SUPPLY |
| RS | RESISTOR |
| VDD | DIRECT CURRENT POWER SUPPLY TERMINAL |
| V1, V2 | DIRECT CURRENT VOLTAGE |

-continued

| | Reference Signs List |
|---|---|
| IC | ERROR CURRENT |
| IC_H | HIGH-FREQUENCY ERROR CURRENT |
| IC_L | LOW-FREQUENCY ERROR CURRENT |
| IM | CURRENT |
| IRL | CURRENT |
| VC | AMPLITUDE MODULATED SIGNAL |
| VC_H | H1GH-FREQUENCY AMPLITUDE MODULATED SIGNAL |
| VC_L | LOW-FREQUENCY AMPLITUDE MODULATED SIGNAL |
| VOUT | MODULATED POWER SUPPLY SIGNAL |

The invention claimed is:

1. A power amplifier that amplifies a modulated signal including amplitude modulated components and phase modulated components, the power amplifier comprising:
    a first voltage source that amplifies low-frequency components of the amplitude modulated components of the modulated signal to output a first voltage;
    a second voltage source that amplifies high-frequency components of the amplitude modulated components of the modulated signal to output a second voltage;
    a current source that amplifies the amplitude modulated components of the modulated signal to output a current;
    a combiner circuit that combines the first voltage, the second voltage, and the current to generate a modulated power supply signal; and
    an RF amplifier that amplifies a signal obtained by up-converting the modulated signal to a carrier frequency and outputs the amplified signal after modulating amplitude of the amplified signal by the modulated power supply signal.

2. The power amplifier according to claim 1, wherein a combiner circuit comprises:
    a low pass filter that is connected to an output terminal of the first voltage source and removes high-frequency noise of the first voltage source; and
    a high pass filter that is connected to an output terminal of the second voltage source and removes low-frequency noise of the second voltage source, and
    a cutoff frequency of the low pass filter is set to be lower than a cutoff frequency of the high pass filter.

3. The power amplifier according to claim 2, wherein the current source is a feedback amplifier, detects a voltage difference between an output of the current source and a resistor provided between the low pass filter and the high pass filter, and outputs the current so that the voltage difference is decreased.

4. The power amplifier according to claims 1, wherein the first voltage source and the second voltage source synchronize timings of outputting the first voltage and the second voltage.

5. The power amplifier according to claims 1, wherein the current source comprises:
    a pulse modulator that converts a detection value of an output current of the combiner circuit into a pulse modulated signal;
    a switching amplifier that amplifies the pulse modulated signal; and
    a smoothing filter that smoothes an output signal of the switching amplifier to output a current.

6. The power amplifier according to claims 5, wherein the switching amplifier comprises:
- first and second switching elements that are connected in series between a direct current power supply and a ground terminal; and
- an output terminal that is provided in a connection point where one end of the first switching element and one end of the second switching element are connected with each other,
- wherein the switching amplifier control a current output from the direct current power supply to the output terminal and a current drawn from the output terminal to the ground terminal by the first and second switching elements, so as to amplify the pulse modulated signal.

7. The power amplifier according to claims 5, wherein the switching amplifier comprises:
- a transformer;
- a direct current power supply that is connected to one end of a primary side coil of the transformer;
- a switching element that is connected to the other end of the primary side coil of the transformer;
- a ground terminal that is connected to one end of a secondary side coil of the transformer;
- a first rectifying element that is connected to the other end of the secondary side coil of the transformer; and
- a second rectifying element that is connected between the ground terminal and an output side terminal of the first rectifying element, wherein
- the switching amplifier controls the switching element by the pulse modulated signal, to control the current that flows through the primary side coil of the transformer from the direct current power supply to amplify the pulse modulated signal, and
- the switching amplifier outputs the amplified pulse modulated signal to an output terminal of the second rectifying element through the transformer and the first and second rectifying elements.

8. The power amplifier according to claims 5, wherein the switching amplifier comprises:
- a transformer;
- a first direct current power supply that is connected to one end of a primary side coil of the transformer;
- a switching element that is connected to the other end of the primary side coil of the transformer;
- a second direct current power supply that is connected to one end of a secondary side coil of the transformer;
- a first rectifying element that is connected to the other end of the secondary side coil of the transformer; and
- a second rectifying element that is connected between the second direct current power supply and an output side terminal of the first rectifying element, wherein
- the switching amplifier controls the switching element by the pulse modulated signal, to control the current that flows through the secondary side coil of the transformer from the second direct current power supply to amplify the pulse modulated signal, and
- the switching amplifier outputs the pulse modulated signal amplified to an output terminal of the second rectifying element through the transformer, and the first and second rectifying elements.

9. The power amplifier according to claims 5, wherein the smoothing filter is an inductor element and serves as a low pass filter.

10. The power amplifier according to claims 1, wherein the current source comprises:
- a pulse signal source that outputs a pulse modulated signal;
- a switching amplifier that amplifies the pulse modulated signal; and
- a smoothing filter that smoothes an output signal of the switching amplifier to output a current.

11. The power amplifier according to claim 10, wherein the pulse signal source outputs the pulse modulated signal that is synchronized with at least one of the first voltage and the second voltage.

12. The power amplifier according to claims 1, wherein the amplitude modulated components of the modulated signal are extracted by a polar modulator from the modulated signal.

13. A power amplifier that amplifies a modulated signal including amplitude modulated components and phase modulated components as a transmission signal, the power amplifier comprising:
- a first voltage source that amplifies low-frequency components of the amplitude modulated components of the modulated signal to output a first voltage;
- a second voltage source that amplifies high-frequency components of the amplitude modulated components of the modulated signal to output a second voltage;
- a current source that amplifies the amplitude modulated components of the modulated signal to output a current;
- a combiner circuit that combines the first voltage, the second voltage, and the current to generate a modulated power supply signal; and
- an RF amplifier that amplifies a signal obtained by up-converting the phase modulated components to a carrier frequency and outputs the amplified signal after modulating amplitude of the amplified signal by the modulated power supply signal.

14. A power amplifying method that amplifies a modulated signal including amplitude modulated components and phase modulated components, the method comprising:
- amplifying low-frequency components of the amplitude modulated components of the modulated signal to output a first voltage;
- amplifying high-frequency components of the amplitude modulated components of the modulated signal to output a second voltage;
- amplifying the amplitude modulated components of the modulated signal to output a current;
- combining the first voltage, the second voltage, and the current to generate a modulated power supply signal, and
- amplifying a signal obtained by up-converting the modulated signal to a carrier frequency, and outputting the amplified signal after modulating amplitude of the amplified signal by the modulated power supply signal.

15. The power amplifying method according to claim 14, wherein the amplitude modulated components of the modulated signal are extracted by a polar modulator from the modulated signal.

16. A power amplifying method that amplifies a modulated signal including amplitude modulated components and phase modulated components, the method comprising:
- amplifying low-frequency components of the amplitude modulated components of the modulated signal to output a first voltage;
- amplifying high-frequency components of the amplitude modulated components of the modulated signal to output a second voltage;
- amplifying the amplitude modulated components of the modulated signal to output a current;

combining the first voltage, the second voltage, and the current to generate a modulated power supply signal; and amplifying a signal obtained by up-converting the phase modulated components to carrier frequency, and outputting the amplified signal after modulating amplitude of the amplified signal by the modulated power supply signal.

* * * * *